United States Patent
Higashino et al.

(10) Patent No.: US 7,148,081 B2
(45) Date of Patent: Dec. 12, 2006

(54) METHOD OF MANUFACTURING A SEMICONDUCTOR DEVICE

(75) Inventors: Tomoko Higashino, Tokyo (JP); Kazunari Suzuki, Tokyo (JP); Chuichi Miyazaki, Akishima (JP)

(73) Assignee: Renesas Technology Corp., Tokyo (JP)

( * ) Notice: Subject to any disclaimer, the term of this patent is extended or adjusted under 35 U.S.C. 154(b) by 229 days.

(21) Appl. No.: 10/855,382

(22) Filed: May 28, 2004

(65) Prior Publication Data

US 2004/0241907 A1 Dec. 2, 2004

(30) Foreign Application Priority Data

May 30, 2003 (JP) .............................. 2003-154840

(51) Int. Cl.
- *H01L 21/50* (2006.01)
- *H01L 21/48* (2006.01)
- *H01L 23/52* (2006.01)
- *H01L 23/48* (2006.01)
- *H01L 27/146* (2006.01)

(52) U.S. Cl. ...................... 438/106; 438/107; 438/118; 257/777; 257/783; 257/E27.137

(58) Field of Classification Search ........ 438/106–107, 438/118, 455; 257/777, 782–783, E27.137
See application file for complete search history.

(56) References Cited

U.S. PATENT DOCUMENTS

| | | | |
|---|---|---|---|
| 6,100,594 A * | 8/2000 | Fukui et al. ................. | 257/777 |
| 6,340,846 B1 * | 1/2002 | LoBianco et al. .......... | 257/783 |
| 6,351,028 B1 * | 2/2002 | Akram ........................ | 257/686 |
| 6,387,728 B1 * | 5/2002 | Pai et al. ..................... | 438/106 |
| 6,503,776 B1 * | 1/2003 | Pai et al. ..................... | 438/106 |
| 6,657,290 B1 * | 12/2003 | Fukui et al. ................. | 257/686 |
| 6,759,745 B1 * | 7/2004 | Masumoto et al. ......... | 257/730 |
| 6,867,500 B1 * | 3/2005 | Corisis et al. .............. | 257/777 |
| 2003/0162325 A1 * | 8/2003 | Tan et al. .................... | 438/109 |

FOREIGN PATENT DOCUMENTS

| | | |
|---|---|---|
| JP | 06-244360 | 9/1994 |
| JP | 2003-078106 | 3/2003 |

* cited by examiner

*Primary Examiner*—Luan Thai
(74) *Attorney, Agent, or Firm*—Antonelli, Terry, Stout and Kraus, LLP.

(57) ABSTRACT

In a semiconductor device in which a plurality of semiconductor chips are stacked on a mounting substrate, an adhesive material formed of resin mainly having a thermosetting property is applied to a semiconductor chip mounting region on the mounting substrate. After mounting semiconductor chips on the adhesive material, the adhesive material is cured by heat treatment. When these parts are naturally cooled to a normal temperature, the mounting substrate warps in a convex shape due to the difference in an α value between the mounting substrate and the semiconductor chip. However, pads are connected by wire bonding and, an adhesive material formed of resin having a thermoplastic property is laminated to the semiconductor chip. Then, a spacer chip is bonded to the adhesive material by thermal compression bonding. Accordingly, due to heat generated at the time of thermal compression bonding, the mounting substrate and the semiconductor chip become substantially flat.

9 Claims, 28 Drawing Sheets

(100~200°C)

1  P1  PA  7  3A        PA    P1

1  P1  PA  7  3A        PA    P1

METHOD OF MANUFACTURING A SEMICONDUCTOR DEVICE

CROSS-REFERENCE TO RELATED APPLICATION

The present application claims priority from Japanese patent application JP 2003-154840 filed on May 30, 2003, the content of which is hereby incorporated by reference into this application.

BACKGROUND OF THE INVENTION

The present invention relates to a semiconductor device and TO a technique for use in the manufacture thereof, and, more particularly, the invention relates to a technique which is applicable to a semiconductor device having a plurality of semiconductor chips mounted on a mounting substrate thereof.

With an aim toward realization of multi-functioning, high integration and miniaturization of a semiconductor device, there has been proposed a stacked package in which a plurality of semiconductor chips are three-dimensionally mounted on a mounting substrate. Further, in some memory products or the like, for the purpose of obtaining high integration, a plurality of the same semiconductor chips are stacked.

For example, in the following patent literatures 1 or 2, a chip-stacking-type package element, in which semiconductor IC elements having a same size are stacked, and a manufacturing method thereof are disclosed.

[Patent Literature 1]
Japanese Unexamined Patent Publication 2003-78106 (FIG. 1)

[Patent Literature 2]
Japanese Unexamined Patent Publication Hei 6(1994)-244360 (FIG. 1)

SUMMARY OF THE INVENTION

The inventors of the present invention have made extensive efforts toward development of a BGA (ball grid array) and CSP (chip size package) in which a plurality of semiconductor chips (elements, pellets) are stacked inside one package.

Although an adhesive material is used for mounting semiconductor chips on a mounting substrate, defective adhesion is often found at the time of stacking a plurality of semiconductor chips. Such defective adhesion occurs for the following reason.

At the time of mounting semiconductor chips on the mounting substrate, when a resin (adhesive material) in a paste form is used, heat treatment is performed for curing the resin. Here, when the ambient temperature returns to room temperature from a curing temperature, the mounting substrate (for example, made of glass epoxy resin) and the semiconductor chips (for example, made of silicon) shrink. Due to the difference in the thermal expansion coefficient ($\alpha$) between these materials, a warp is generated on the mounting substrate and the semiconductor chip. It is found that when another semiconductor chip is further stacked on the semiconductor chip which is warped in such a manner, it is difficult to ensure the desired adhesiveness. Further, it has also been found that such a warp becomes a cause of peeling-off or inclination of the semiconductor chip. These drawbacks will further explained in detail later in conjunction with FIG. 14 and FIG. 15.

Accordingly, the inventors of the present invention have focused their attention on an adhesive material used at the time of stacking a plurality of semiconductor chips and have studied a technology for improving the adhesiveness of the semiconductor chips by taking the assembling process used in the formation of the semiconductor device, the size of the semiconductor chip to be stacked and the like into consideration.

Here, after completion of the present invention, the inventors of the present invention carried out a search and found the above-mentioned patent literatures 1 and 2. Although a plurality of materials are enumerated as an adhesive material in the above-mentioned patent literature 1, no description is found with respect to the properties of the respective adhesive materials and the selective use of the adhesive materials for respective assembling stages of the semiconductor device.

Further, the inventors of the present invention have, through the contrivance of a shape of the semiconductor chip, studied the structure of a semiconductor device and a manufacturing method thereof which can achieve further miniaturization of the semiconductor device and further simplification of the manufacturing steps.

It is an object of the present invention to enhance the reliability of a semiconductor device having a plurality of chips.

It is another object of the present invention to achieve miniaturization or high-density packaging of a semiconductor device having a plurality of semiconductor chips.

The above-mentioned and other objects and novel features of the present invention will become more evident from the description provided in this specification and the attached drawings.

A brief explanation of representative aspects of the invention disclosed in this specification is as follows.

A method of manufacturing a semiconductor device of the present invention comprises the steps of (a) mounting a first semiconductor chip on a mounting substrate by way of a first adhesive material, (b) fixing the first semiconductor chip to the mounting substrate by curing the first adhesive material by heat treatment after the step (a), and (c) mounting a second semiconductor chip over the first semiconductor chip after the step (b), wherein the second semiconductor chip is adhered to the first semiconductor chip by way of a second adhesive material in a state such that the surface of the first semiconductor chip is made flatter than the state before applying heat by applying the heat to the mounting substrate and the first semiconductor chip.

In a semiconductor device of the present invention in which at least first and second semiconductor chips are stacked on a mounting substrate, (a) the first semiconductor chip which is mounted directly above the mounting substrate is fixed by resin mainly including a thermosetting property, and (b) the second semiconductor chip which is mounted above the first semiconductor chip is fixed by resin mainly comprised of a thermoplastic property.

A method of manufacture of a semiconductor device of the present invention comprises the steps of: (a) mounting a semiconductor chip having a cutout portion in an outer peripheral portion of a back surface thereof and forming a projecting portion on a center portion of the back surface by way of resin mainly comprising a thermosetting property on a mounting substrate; and (b) fixing the semiconductor chip to the mounting substrate by curing the resin using heat treatment after the step (a).

A semiconductor device of the present invention comprises: (a) a mounting substrate; (b) a semiconductor chip which is mounted on the mounting substrate, the semiconductor chip having a cutout portion in an outer peripheral portion of a back surface thereof and forming a projecting portion on a center portion of the back surface; and (c) resin mainly having a thermosetting property which is formed between the mounting substrate and the semiconductor chip.

DETAILED DESCRIPTION OF THE PREFERRED EMBODIMENTS

Embodiments of the present invention will be explained in detail in conjunction with the drawings hereinafter. Here, in all of the drawings, the same symbols are given to identical parts, and a repeated explanation thereof is omitted. Further, the respective embodiments are relevant to each other, and, hence, the same or similar symbols are given to identical or similar parts in respective embodiments and a repeated explanation thereof is omitted. Further, when the respective embodiments have the same or a similar constitution, it is assumed that these constitutions have the same or similar advantageous effects and a repeated explanation thereof is omitted.

Embodiment 1

FIG. 1 to FIG. 13 are cross-sectional views of characteristic parts showing steps in the manufacture of a semiconductor device according to this embodiment.

First of all, the constitution of the semiconductor device according to this embodiment will be explained. Here, since the structure is clarified further in the explanation of the manufacturing steps of the semiconductor device of this embodiment to be described later, only the main constitution will be explained.

Figure 13:
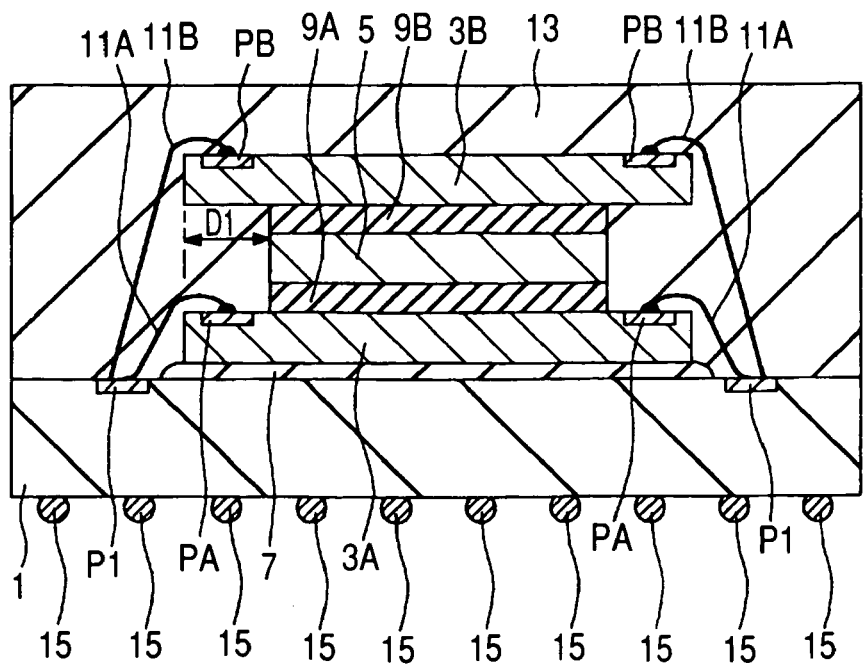
FIG. 13 is a cross-sectional view of a characteristic part showing the manufacturing step of the semiconductor device according to the embodiment 1 of the present invention.

As shown in FIG. 13, which is a view showing the final step, in the manufacture of the semiconductor device of this embodiment, on a main surface of a mounting substrate (printed wiring board, package board) 1, two semiconductor chips 3A, 3B, which have a the substantially same shape, are mounted. Further, between these semiconductor chips 3A, 3B, a spacer chip 5 is arranged, wherein a space is ensured on an outer peripheral portion of the semiconductor chip 3A so as to prevent short-circuiting of wires 11A and the semiconductor chip 3B. For example, the thicknesses of the semiconductor chips 3A, 3B are approximately 50 to 200 μm and the thickness of the spacer chip 5 is approximately 50 to 200 μm. Further, the distance D1 between an end portion of the semiconductor chip 3A and an end portion of the spacer chip 5 is approximately 200 to 500 μm.

The mounting substrate 1 is a multi-layered printed wiring board which is mainly made of general-use resin, such as epoxy resin containing glass fibers (glass epoxy resin), for example. That is, the mounting substrate has a structure in which a plurality of so-called printed circuit boards (not shown in the drawings) are stacked, each of which has wirings formed on a front surface and a back surface using a printing method or the like, and the respective wirings of the plurality of printed circuit boards are suitably connected through vias. Further, on the surface of the mounting substrate 1, a plurality of pads (bonding pads) P1 are formed. The pads are arranged on, for example, an outer peripheral portion of the mounting substrate (see FIG. 48 or the like).

The wires are formed of a conductive material, such as gold, and the semiconductor chips are formed of semiconductor material, such as silicon. Further, the spacer chip is also formed of semiconductor material, such as silicon. By forming the spacer chip using the same material as the semiconductor chips, the difference in the thermal expansion coefficient can be reduced as much as possible, and, hence, the stress can be reduced. Other materials are also applicable to the spacer chip. For example, the spacer may be formed of a polycrystalline silicon chip or a polyimide resin layer which is preliminarily printed on a surface of a lower-side semiconductor chip. In this case, compared to the case which uses a spacer chip formed of silicon, the material cost and the manufacturing cost can be reduced.

In the inside of the semiconductor chips 3A, 3B, a plurality of semiconductor dies and wirings (not shown in the drawing) are formed, and their surfaces are covered with a protective film. Further, a plurality of pads PA, PB are exposed from opening portions of the protective film. These pads constitute exposed portions of the uppermost-layer wirings and are arranged on, for example, outer peripheral portions of the respective semiconductor chips (see FIG. 47 and the like).

The wires 11A connect the pads (bonding pads) PA formed over the surface of the semiconductor chip 3A and the pads P1 formed over the surface of the mounting substrate 1, while the wires 11B connect the pads (bonding pads) PB formed over the surface of the semiconductor chip 3B and the pads P1 formed over the surface of the mounting substrate 1. On the surface of the mounting substrate 1, the plurality of pads P1 are formed and the wires 11A, 11B are connected to the different pads P1 (see FIG. 48 and the like). Here, some of the wires 11A, 11B may be connected to the pads P1 at the same position. Further, the loop height of the wires 11A (a distance from the surface of the semiconductor chip 3A to the highest position of the wires 11A) is approximately 100 to 300 µm, while the loop height of the wires 11B (a distance from the surface of the semiconductor chip 3B to the highest position of the wires 11B) is approximately 300 to 1000 µm.

Here, the mounting substrate 1 and the semiconductor chip 3A are fixed to each other by way of an adhesive material 7. The adhesive material 7 is made of resin having mainly a thermosetting property, for example. On the other hand, the spacer chip 5 and the semiconductor chip 3B are fixed to each other by way of an adhesive material 9B. The adhesive material 9B is made of a resin having a thermoplastic property, for example. Further, the semiconductor chip 3A and the spacer chip 5 are fixed to each other by way of an adhesive material 9A. The adhesive material 9A is made of a resin having a thermoplastic property, for example.

In this manner, according to this embodiment, the adhesive material for the semiconductor chip 3A, which is mounted on the mounting substrate 1, and the adhesive material for the semiconductor chip 3B, which is positioned above the semiconductor chip 3A, are made different from each other, and, hence, their adhesive properties can be enhanced.

To be more specific, the resin having mainly a thermosetting property, for example, is used as the adhesive material 7 and the resin having the thermoplastic property, for example, is used as the adhesive materials 9A, 9B. Further, the thickness of the adhesive material 7 is approximately 5 to 50 µm and the thicknesses of adhesive materials 9A, 9B are approximately 5 to 50 µm.

Here, the properties and specific example of the composition of these adhesive materials 7, 9A and 9B will be explained in further detail in of this specification in connection with the explanation of the manufacturing steps.

The peripheries of the semiconductor chips 3A, 3B and the wires 11A, 11B are covered with mold resin 13. Further, on a back surface of the mounting substrate 1, bump electrodes 15, which are formed of solder or the like, are arranged in a specific area, for example. These bump electrodes 15 are electrically connected with the pads P1 by way of a plurality of wiring layers and vias (connecting portions) in the inside of the mounting substrate 1 (not shown in the drawing).

Next, a method (assembling steps) of manufacture of the semiconductor device of this embodiment will be explained in conjunction with FIG. 1 to FIG. 13.

Figure 1:
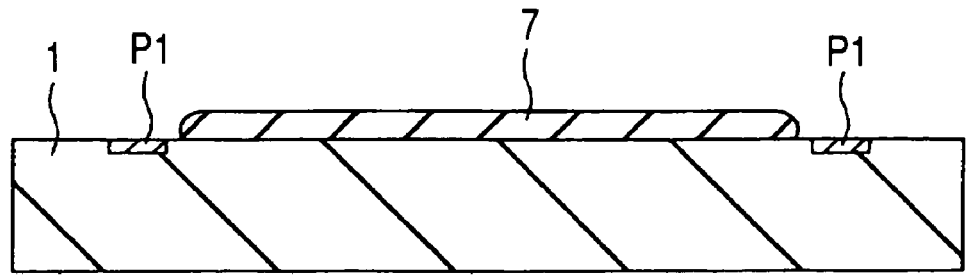
FIG. 1 is a cross-sectional view of a characteristic part showing a manufacturing step of a semiconductor device according to an embodiment 1 of the present invention.

As shown in FIG. 1, at a normal temperature (room temperature), the adhesive material 7 is applied to a semiconductor chip mounting region on the mounting substrate 1. The adhesive material 7 is a paste-like resin and is formed of resin mainly having a thermosetting property. To be more specific, the adhesive material 7 is formed of an epoxy-based resin. With respect to the properties of the resin, the resin is formed into a paste form by being mixed with a solvent, and curing thereof occurs due to a reaction of the resin along with evaporation of the solvent at the time of heating the resin. Due to this curing, a semiconductor chip can be fixed to the mounting substrate 1. Further, once the thermosetting resin is cured, the thermosetting resin does not melt even when heat is applied.

In this manner, according to this embodiment, with the use of a resin mainly having a thermosetting property on the mounting substrate 1, it is possible to achieve a reduction of the cost. That is, compared to a film-like resin having a thermoplastic property, as will be described later, the resin mainly having a thermosetting property serves a general purpose and is inexpensive in many cases. Further, with the use of the paste-like resin, it is possible to supply the resin such that the resin can fill the surface of the mounting substrate 1, which has relatively large surface irregularities due to the influence of the thickness of the wiring and the thickness of an insulation film which covers the wirings, whereby the adhesiveness between the mounting substrate 1 and the semiconductor chip 3A arranged above the mounting substrate 1 can be enhanced.

Figure 2:
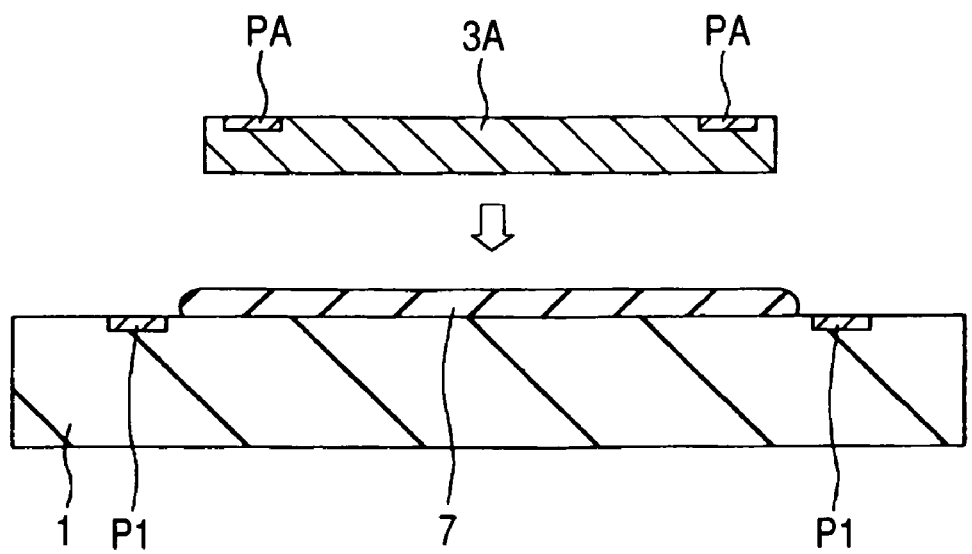
FIG. 2 is a cross-sectional view of a characteristic part showing the manufacturing step of the semiconductor device according to the embodiment 1 of the present invention.
Figure 3:
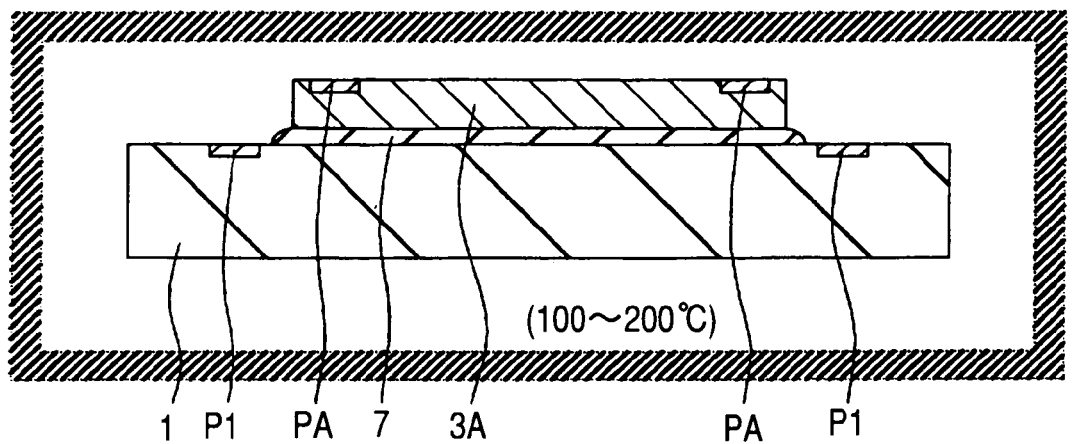
FIG. 3 is a cross-sectional view of a characteristic part showing the manufacturing step of the semiconductor device according to the embodiment 1 of the present invention.

Next, as shown in FIG. 2, the semiconductor chip 3A is mounted on the adhesive material 7 at a normal temperature, and, thereafter, as shown in FIG. 3, heat treatment is applied to the mounting substrate 1 so as to cure the adhesive material 7. The heat treatment is performed by exposing the mounting substrate 1 in an atmosphere of, for example, 100 to 200° C. As a result, the semiconductor chip 3A is fixed to the mounting substrate 1. On an outer periphery of the semiconductor chip mounting region of the mounting substrate 1, the pads P1 are exposed. Further, pads PA are exposed from the surface of the semiconductor chip 3A.

Figure 4:
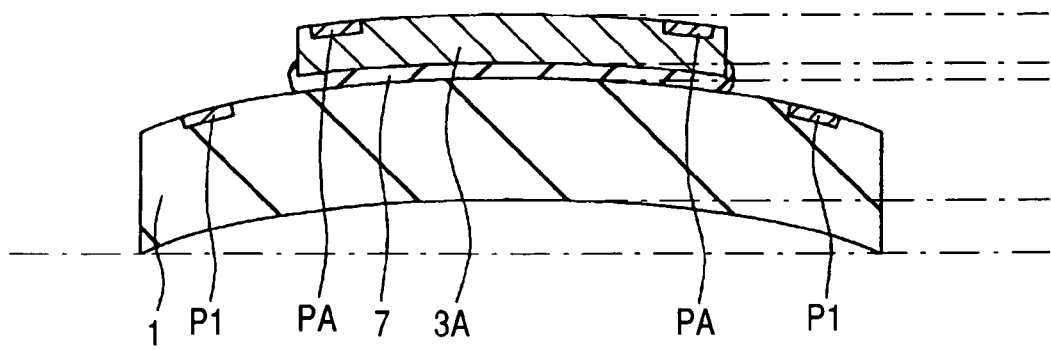
FIG. 4 is a cross-sectional view of a characteristic part showing the manufacturing step of the semiconductor device according to the embodiment 1 of the present invention.

Here, the mounting substrate 1 is held as it is so as to be naturally cooled to a normal temperature. Here, although the mounting substrate 1 and the semiconductor chip 3A respectively shrink, they differ with respect to an $\alpha$ value from each other, and, hence, they differ in shrinking rate. This $\alpha$ value is the thermal expansion coefficient. The $\alpha$ value of silicon (Si) is $3.5 \times 10^{-6}/°$ C. and the $\alpha$ value of the glass epoxy board is approximately $12 \times 10^{-6}/°$ C. to $16 \times 10^{-6}/°$ C. As the result, as shown in FIG. 4, the mounting substrate 1, and the like, warps in a convex shape.

Figure 5:
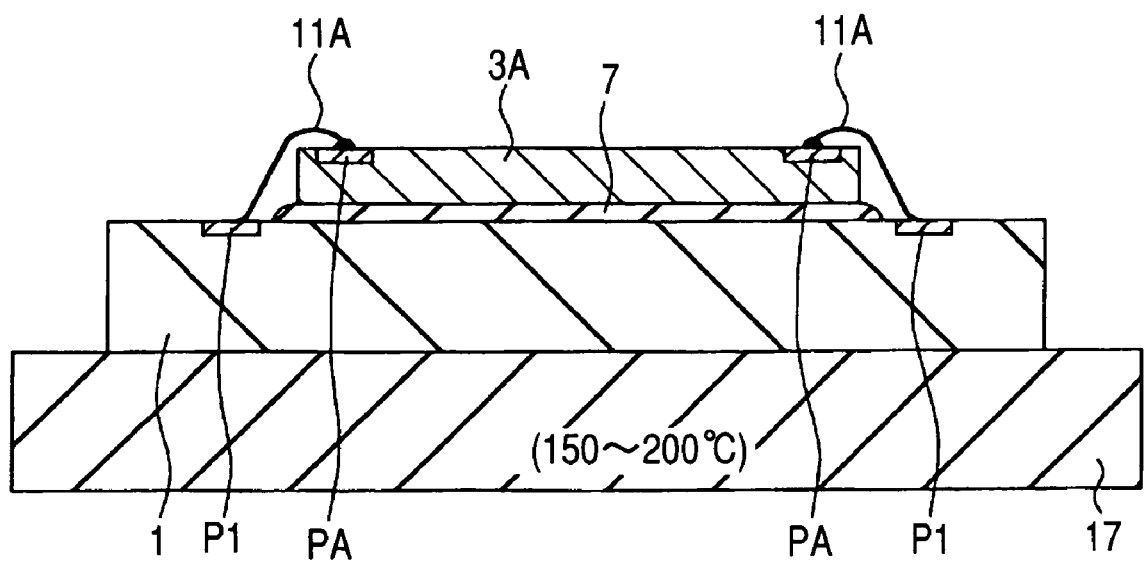
FIG. 5 is a cross-sectional view of a characteristic part showing the manufacturing step of the semiconductor device according to the embodiment 1 of the present invention.

Next, the pads P1 formed over the mounting substrate 1 and the pads PA formed over the semiconductor chip 3A are connected to each other by the wires 11A (first wire bonding). In this case, as shown in FIG. 5, the mounting substrate 1 is mounted on a heating stage 17 and wire bonding is performed by heating the mounting substrate 1 at a temperature of approximately 150 to 200° C. Accordingly, in the midst of the wire bonding, the mounting substrate 1 and the semiconductor chip 3, respectively, become flat due to heating. The wire bonding is performed using a wire bonder which uses ultrasonic vibrations and thermo compression bonding processing together.

Figure 6:
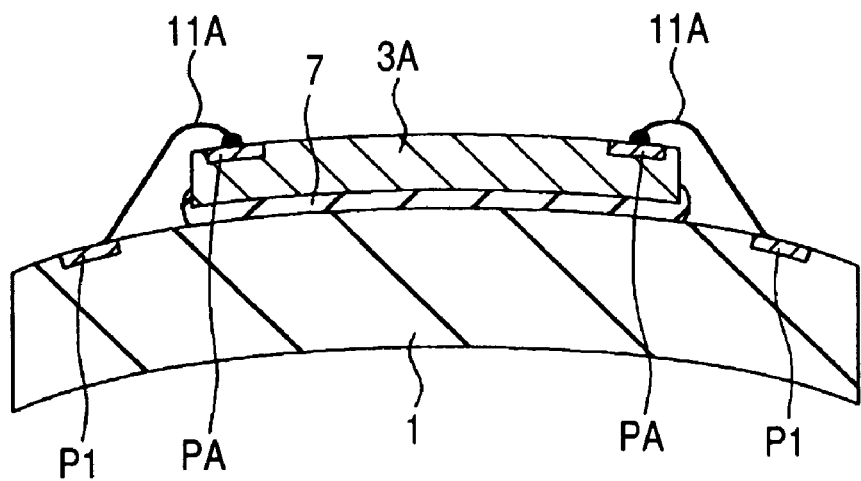
FIG. 6 is a cross-sectional view of a characteristic part showing the manufacturing step of the semiconductor device according to the embodiment 1 of the present invention.

Next, the mounting substrate 1 is held as it is so as to be naturally cooled to a normal temperature. As shown in FIG. 6, the mounting substrate 1 and the like again warp so as to have a convex shape.

Figure 7:
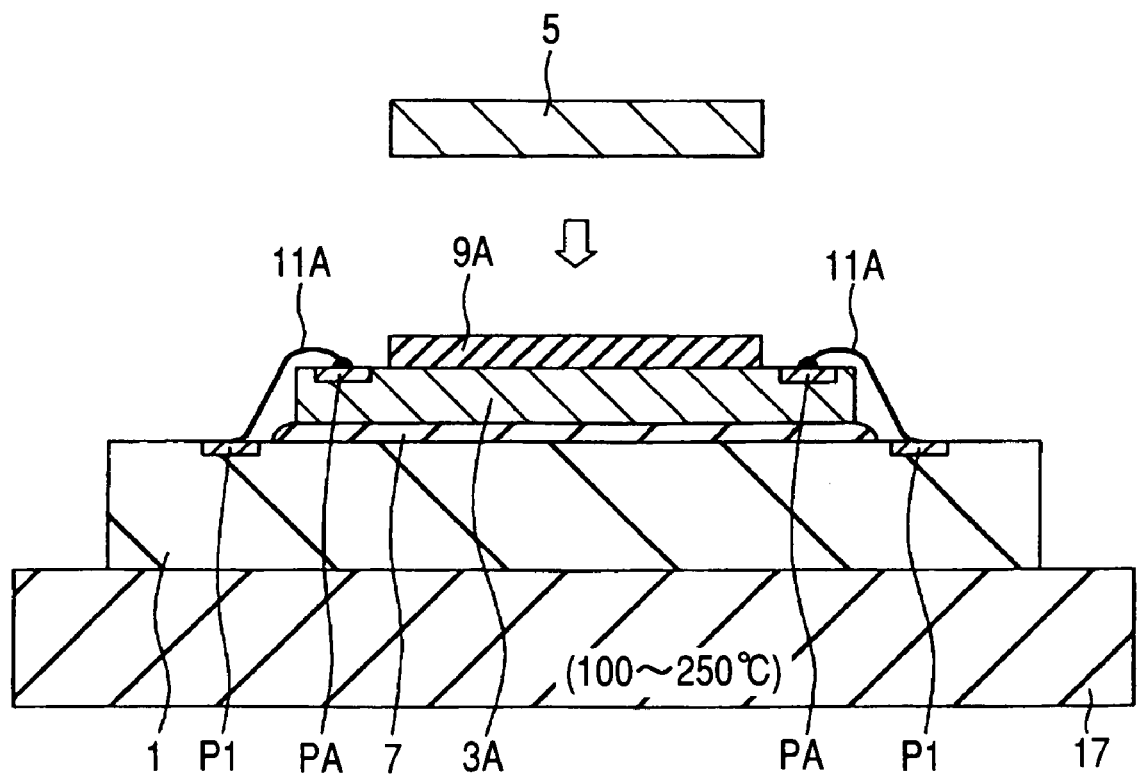
FIG. 7 is a cross-sectional view of a characteristic part showing the manufacturing step of the semiconductor device according to the embodiment 1 of the present invention.

Then, as shown in FIG. 7, the adhesive material 9A is laminated to the semiconductor chip 3A and the spacer chip 5 is bonded to the adhesive material 9A by thermo compression bonding processing. That is, the mounting substrate 1 is mounted on a heating stage and is heated at a temperature of approximately 100 to 250° C. and, at the same time, the spacer 5 is pressed on the adhesive material 9A (semiconductor chip 3A).

In this case, the mounting substrate 1 and the semiconductor chip 3A, respectively, become substantially flat. In other words, the flatness of the mounting substrate 1 and the semiconductor chip 3A is enhanced compared to the state before the heat is applied to the mounting substrate 1 and the semiconductor chip 3A (for example, the state shown in FIG. 6). As a result, the adhesiveness of the semiconductor chip 3A and the spacer chip 5 is enhanced. Further, the adhesive material 9A can ensure a constant adhesive strength, adhesive area and resin thickness thereof.

Here, it may be possible that the adhesive material 9A is laminated to a back surface (lower surface) of the spacer chip 5 and is bonded to the semiconductor chip 3A by a thermo compression bonding process.

Here, the adhesive material 9A is made of resin having a thermoplastic property. That is, during heating, the adhesive material 9A is not cured and the adhesive material 9A per se is melted and has a tackiness. Thereafter, when the adhesive material 9A is naturally cooled, the resin is cured and the spacer chip 5 is fixed to the semiconductor chip 3A. However, the adhesive material 9A is not always constituted of a only thermoplastic resin. For example, it may be possible to use a film which applies a thermosetting resin to a surface of a main film portion made of a thermoplastic resin, wherein at the time of laminating the film to the semiconductor chip 3A, the adhesion is performed by making use of the property of the above-mentioned thermosetting resin and, at the time of fixing the spacer chip to the semiconductor chip 3A, the adhesion is performed by making use of the property of the thermoplastic resin. Further, a similar processing can be performed by using mixed resin formed of a thermoplastic resin and a thermosetting resin.

In this manner, the "resin having the thermoplastic property" referred to in this embodiment means a resin which has some adhesiveness when heat is applied to the resin and is cured thereafter. Accordingly, even when a thermosetting resin having a small reactivity and a thermosetting resin which is not completely cured (polymerized), provided that these resins can ensure the required adhesiveness during the heating period of the die bonding and, thereafter, the semiconductor chip arranged above the thermosetting resin can be fixed at a desired position by curing, these resins can be also used.

Further, the adhesive material 9A has a property such that the content of solvent is small, and, hence, the adhesive material 9A can be formed in a film shape (not in a paste shape). To the contrary, it is possible to form the adhesive material 7 into a paste shape by adding a solvent into the resin, whereby the solvent evaporates at the time of curing by heat.

As the specific composition of the adhesive material 9A, for example, a mixture of epoxy resin and thermoplastic resin, and a mixture of polyimide resin and epoxy resin or the like, has been proposed. Further, the adhesive material 9A may contain an inorganic material filler or the like therein.

Figure 14:
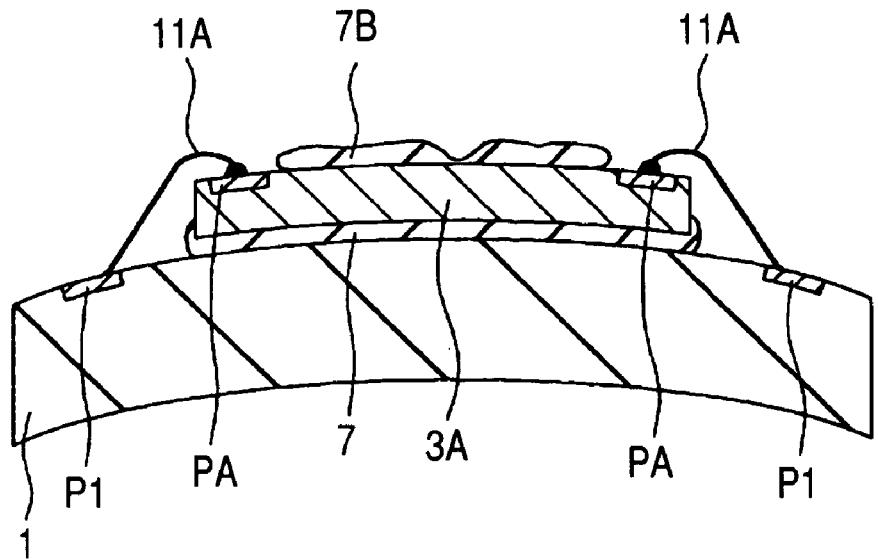
FIG. 14 is a cross-sectional view of a characteristic part showing a manufacturing method of the semiconductor device for showing an effect of the embodiment 1 of the present invention.
Figure 15:
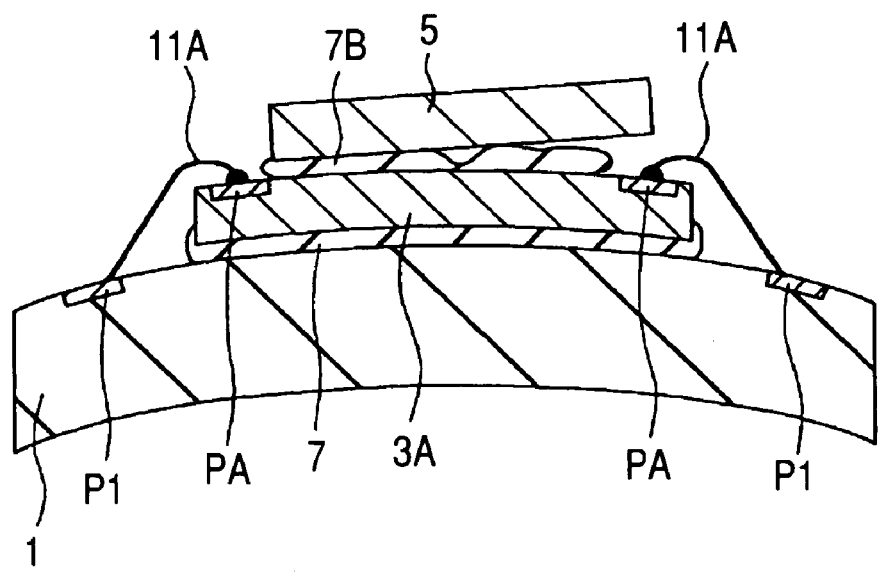
FIG. 15 is a cross-sectional view of a characteristic part showing the manufacturing method of the semiconductor device for showing the effect of the embodiment 1 of the present invention.

According to this embodiment, since the spacer 5 is bonded by thermo compression bonding processing, that is, since the spacer 5 is adhered by heating, the adhesiveness of the spacer chip 5 can be enhanced. For example, as shown in FIG. 14, even when adhesive material 7B, which is a paste-like resin and is formed of resin mainly including a thermosetting property, is applied to the spacer chip mounting region on the semiconductor chip 3A, since the surface of the semiconductor chip 3A is warped so that the mounting substrate 1 or the like is in a convex shape, the adhesive material 7B cannot be supplied in a stable manner. Further, as shown in FIG. 15, even when the spacer chip 5 is mounted on the adhesive material 7B, it is impossible to mount the spacer chip 5 parallel to the mounting substrate 1 and the semiconductor chip 3A. Accordingly, even when the adhesive material 7B is cured by the heat treatment, the adhesiveness of the spacer chip 5 is weak, and, hence, it is difficult to ensure the desired adhesive strength, the desired adhesive area and the desired resin thickness. Further, the above-mentioned phenomenon becomes a cause of peeling-off of the semiconductor chip or the occurrence of cracks in the semiconductor chip. Still further, when the spacer chip 5 is mounted in an inclined state and the other semiconductor chip is stacked thereon, the semiconductor chip is also mounted in an inclined state, and, hence, it is difficult to perform the succeeding wiring bonding with a favorable control.

In this manner, when the chip (semiconductor chip or spacer chip) is further stacked over the mounting substrate to which the thermal load is once applied, so long as the adhesive material 7B is used, it is difficult to stack the chip with enough adhesiveness.

To the contrary, in this embodiment, as mentioned previously, the spacer chip 5 is bonded by a thermal compression bonding process, and, hence, the adhesiveness of the spacer chip 5 can be enhanced.

Here, FIG. 14 and FIG. 15 are cross-sectional views of a characteristic part for showing a method of manufacture of the semiconductor device to exhibit advantageous effects obtained by this embodiment.

In this manner, the adhesive material 9A is laminated to the semiconductor chip 3A and the spacer chip 5 is bonded to the adhesive material 9A by thermo compression bonding processing, and, thereafter, when these parts are cooled naturally to a normal temperature, the mounting substrate 1 and the like again warp in a convex shape (not shown in the drawing).

Figure 8:
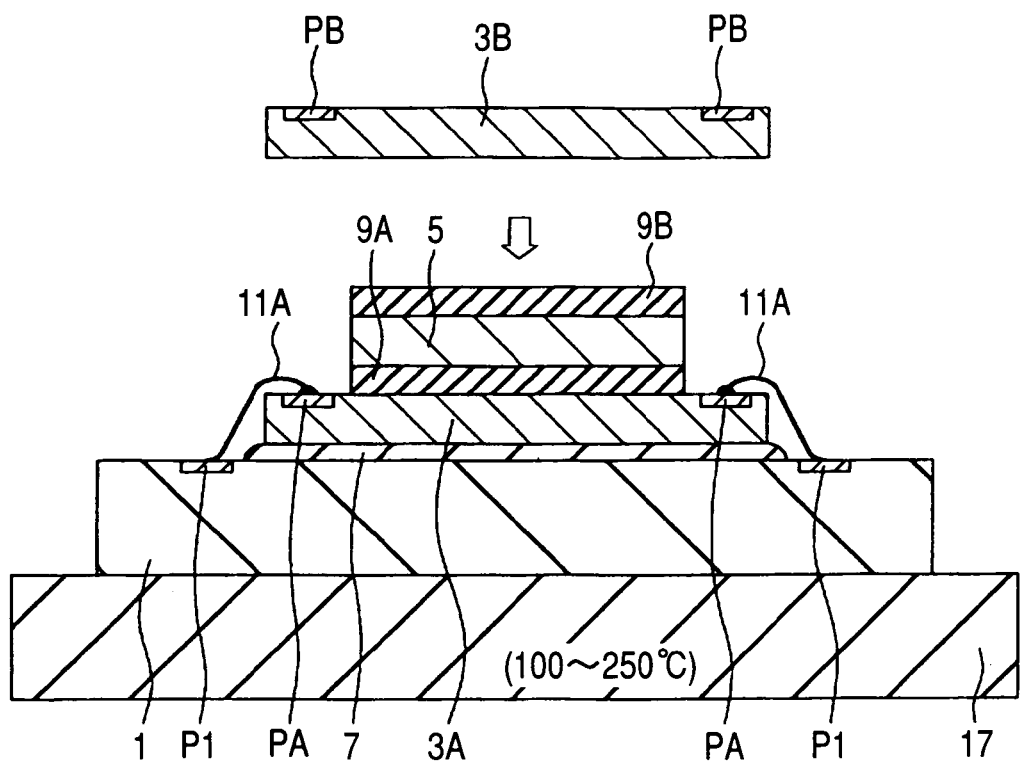
FIG. 8 is a cross-sectional view of a characteristic part showing the manufacturing step of the semiconductor device according to the embodiment 1 of the present invention.

Next, as shown in FIG. 8, the adhesive material 9B is laminated to the spacer chip 5 and the semiconductor chip 3B is bonded to the adhesive material 9B by thermo compression bonding processing. That is, in a state in which the mounting substrate 1 is mounted on a heating stage 17 and is heated at a temperature of approximately 100 to 250° C., the semiconductor chip 3B is pressed on the adhesive material 9B (spacer chip 5). This adhesive material 9B is also made of resin having a thermoplastic property in the same manner as the adhesive material 9A. Further, the adhesive material 9B is made of a film-like resin. Here, in this case also, the adhesive material 9B may be laminated to the back surface of the semiconductor chip 3B and the semiconductor chip 3B may be bonded to the spacer chip 5 by thermo compression bonding processing.

In this manner, the adhesion (fixing) of the semiconductor chip 3B is also performed in a state in which the semiconductor chip 3B is bonded while being heated, and, hence, it is possible to enhance the adhesiveness thereof in the same manner as the adhesion of the spacer chip 5.

Figure 9:
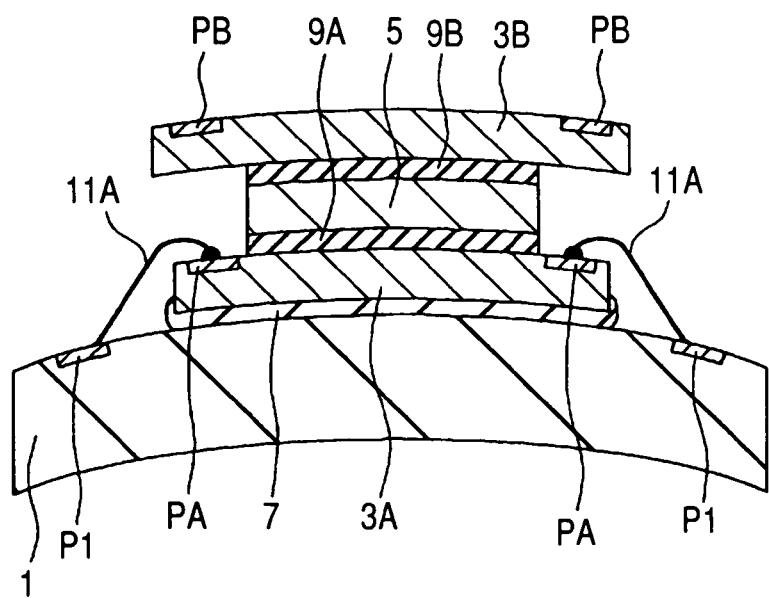
FIG. 9 is a cross-sectional view of a characteristic part showing the manufacturing step of the semiconductor device according to the embodiment 1 of the present invention.

Next, when these parts are cooled naturally to a normal temperature, as shown in FIG. 9, the mounting substrate 1 and the like warp in a convex shape. Here, the pads PB are exposed from an outer peripheral portion of the semiconductor chip 3B.

Figure 10:
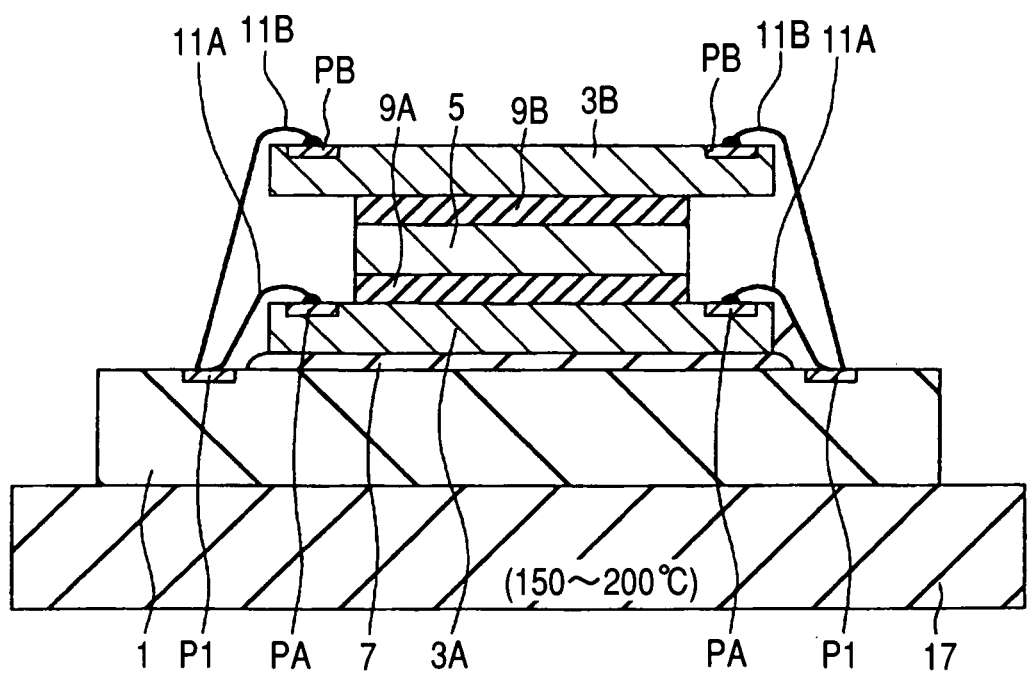
FIG. 10 is a cross-sectional view of a characteristic part showing the manufacturing step of the semiconductor device according to the embodiment 1 of the present invention.

Next, as shown in FIG. 10, the pads P1 formed over the mounting substrate 1 and the pads PB formed over the semiconductor chip 3B are connected to each other by wires 11B (second wire bonding). In this case, as shown in the drawing, the mounting substrate 1 is mounted on the heating stage 17; and, thereafter, the wire bonding is performed by heating the mounting substrate 1 at a temperature of approximately 150 to 200° C. Accordingly, in the midst of the wire bonding, the mounting substrate 1, the semiconductor chips 3A, 3B and the like respectively become flat due to heating. This wire bonding is performed using a wire bonder which uses ultrasonic vibrations and thermo compression bonding processing together.

Figure 11:
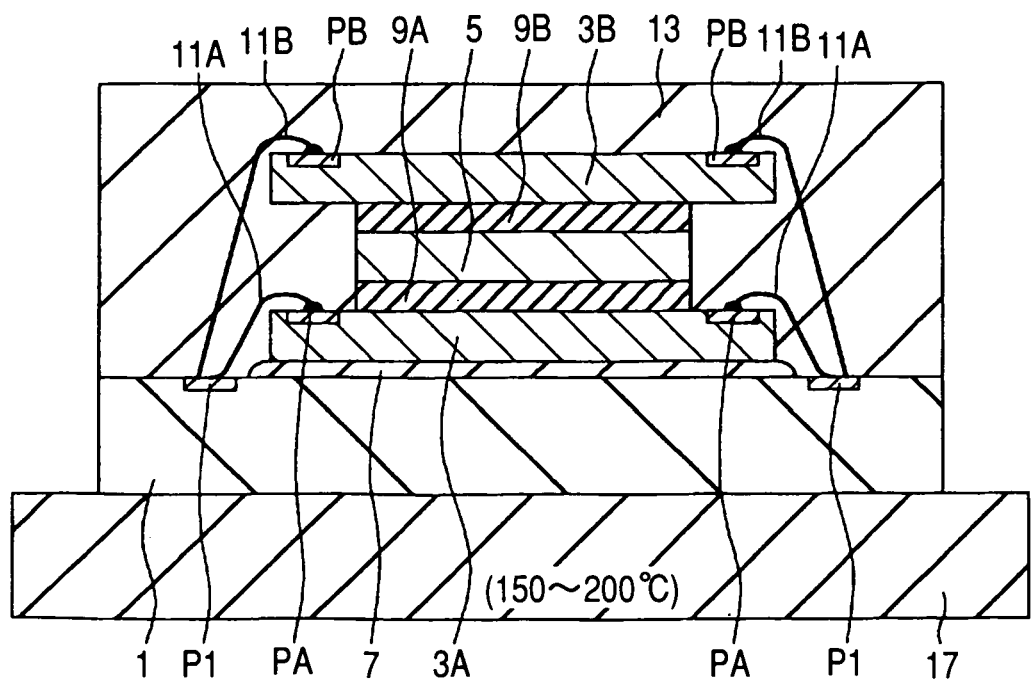
FIG. 11 is a cross-sectional view of a characteristic part showing the manufacturing step of the semiconductor device according to the embodiment 1 of the present invention.

Next, as shown in FIG. 11, the mounting substrate 1, the semiconductor chips 3A, 3B and the like are sandwiched between molds (not shown in the drawing), the mounting substrate 1 side is mounted on the heating stage 17, which is held at a temperature of 150 to 200° C., molten resin (mold resin) is filled in a cavity of the molds, and the peripheries of the semiconductor chips 3A, 3B, the wires 11A, 11B and the like are sealed with mold resin 13. Thereafter, to prevent the mounting substrate 1 and the like from warping in a convex shape even when the mounting substrate 1 is cooled naturally to a normal temperature, the semiconductor device is designed such that the α difference between the mold resin 13 and the mounting substrate 1 is controlled so as to reduce the warping of the semiconductor device.

Figure 12:
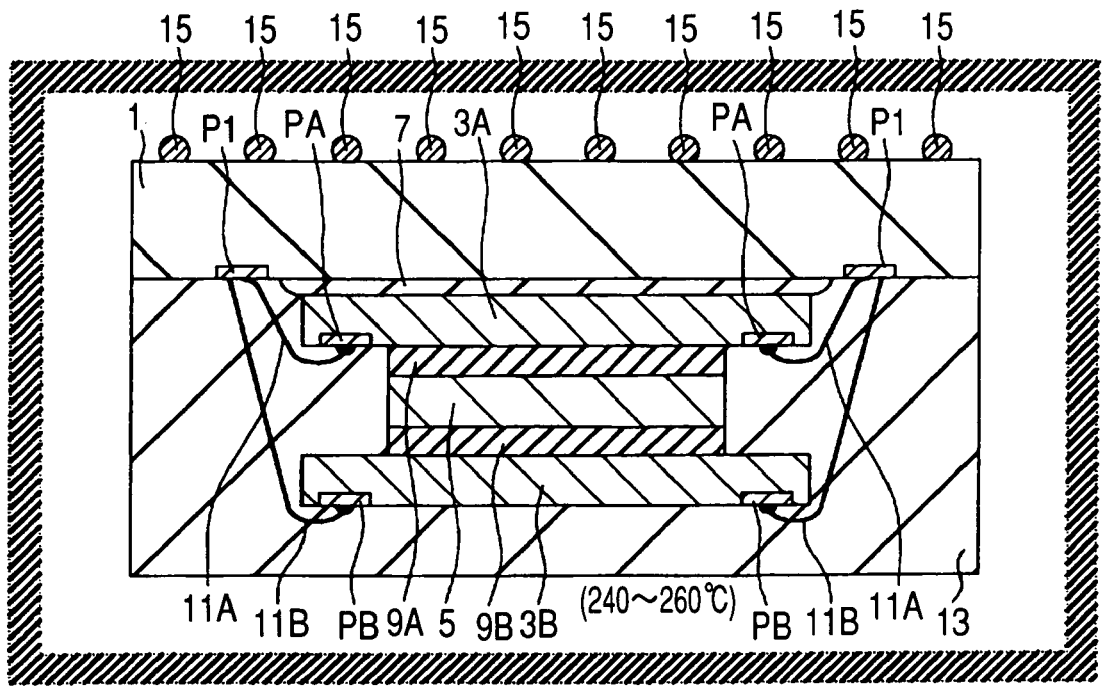
FIG. 12 is a cross-sectional view of a characteristic part showing the manufacturing step of the semiconductor device according to the embodiment 1 of the present invention.

Next, as shown in FIG. 12, after turning over the above-mentioned stacked structure such that the mounting substrate 1 side assumes an upper surface, bump electrodes 15 made of solder or the like are formed. The bump electrodes 15 are formed by supplying, for example, solder balls made of Pb—Sn eutectic alloy having a low melting point to an upper surface of the mounting substrate 1 (a side opposite to a semiconductor-chip-mounting side) and, thereafter, by reflowing the solder balls. For example, the reflow is performed by exposing the mounting substrate 1 and the like in an atmosphere at a temperature of 240 to 260° C.

Then, the above-mentioned structure is turned over again to cause the surface on which the bump electrodes 15 are formed to assume a lower side (FIG. 13), whereby the semiconductor device according to this embodiment is almost completed.

In this manner, according to this embodiment, directly above the mounting substrate, the adhesion (fixing) of the semiconductor chip, which is arranged above the mounting substrate, to the mounting substrate is performed using the resin in a paste form having a thermosetting property; and, thereafter, at the time of adhering the chips (semiconductor chips and spacer chips) which are stacked after the heat treatment for curing the above-mentioned resin, the film-like resin having a thermoplastic property is used. Accordingly, the adhesiveness of respective chips can be enhanced. Further, the reliability of the semiconductor device can be enhanced. Further, the yield rate of the semiconductor device can be enhanced.

A timing of performing the heat treatment for curing the resin in a paste form having a thermosetting property comes before the first wire bonding because the semiconductor chip to which the wire bonding is applied has to be fixed before conducting the wire bonding.

Especially, as in the case of this embodiment, when two semiconductor chips 3A, 3B having substantially the same shape are stacked, the respective pads PA, PB are overlapped as seen in plane view, and, hence, these pads PA, PB cannot be bonded by one wire bonding. Accordingly, the heat treatment for curing the resin must be performed in the course of the manufacturing steps. This embodiment can be effectively applied to such a case. Here, the semiconductor chips 3A, 3B do not always need to have the same size. That is, this embodiment is effectively applicable to any semiconductor device which has a plurality of stacked semiconductor chips and in which pads of any two semiconductor chips are overlapped in plane to the semiconductor chip which is formed over the semiconductor chip. In this manner, by adopting the stacked structure in which the pads are overlapped in plane, miniaturization or high density packaging of the semiconductor device can be realized.

Further, although two semiconductor chips 3A, 3B are stacked in this embodiment, another semiconductor chip may be stacked by way of a spacer chip. In this case, a film-like resin having a thermoplastic property is used for adhesion of the spacer chip and the semiconductor chip.

Embodiment 2

FIG. 16 to FIG. 27 are cross-sectional views of characteristic parts showing steps in the manufacture of a semiconductor device according to this embodiment. This embodiment will be explained in conjunction with the drawings hereinafter. Here, the same or relevant symbols are given to parts identical with the parts of the embodiment 1, and a repeated explanation thereof is omitted. Further, with respect to steps (processes) similar to the steps of the embodiment 1, a repeated explanation thereof is also omitted.

First of all, the constitution of the semiconductor device according to this embodiment will be explained. Here, since the structure is clarified more in the explanation of the steps used in the manufacture of the semiconductor device of this embodiment, to be described later, only the main constitution will be explained here.

Figure 27:
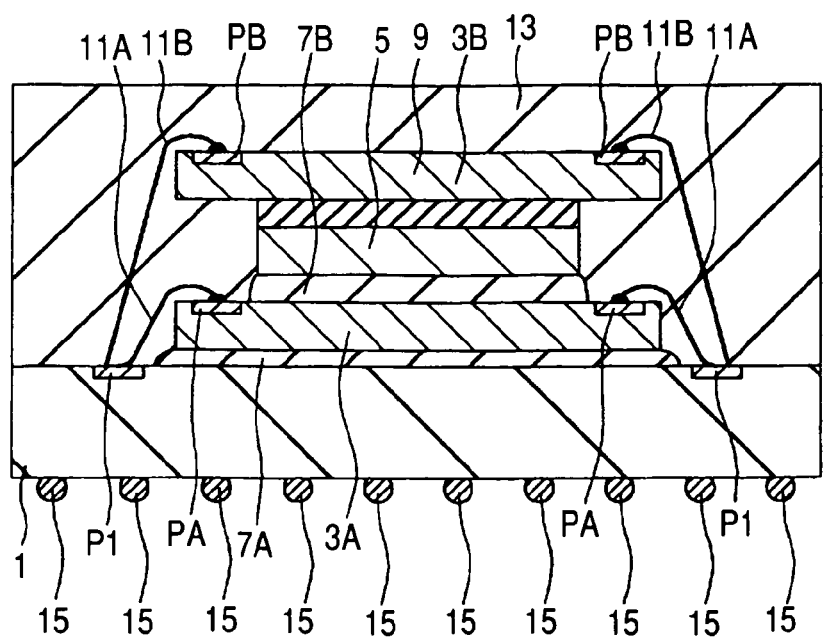
FIG. 27 is a cross-sectional view of a characteristic part showing a manufacturing step of the semiconductor device according to the embodiment 2 of the present invention.

As shown in FIG. 27, which shows a final step in the manufacture of the semiconductor device of this embodiment, on a main surface of a mounting substrate 1, two semiconductor chips 3A, 3B are mounted. Further, between these semiconductor chips 3A, 3B, a spacer chip 5 is arranged.

Here, the constitution which makes this embodiment different from the embodiment 1 lies in the fact that the semiconductor chip 3A and the spacer chip 5 are fixed by way of an adhesive material 7B. These adhesive materials 7B and 7A are, for example, made of a resin mainly having a thermosetting property. Further, the thicknesses of the adhesive materials 7A and 7B are approximately 5 to 50 μm. Here, the spacer chip 5 and the semiconductor chip 3B are fixed by way of an adhesive material 9. The adhesive material 9 is made of a resin having a thermoplastic property, for example.

In this manner, according to this embodiment, the adhesive material used for the semiconductor chip 3A, which is mounted on the mounting substrate 1, differs from the adhesive material used for the semiconductor chip 3B, which is arranged above the semiconductor chip 3A, and, hence, their adhesiveness can be enhanced.

Next, a method (assembling process) of manufacture of the semiconductor device according to this embodiment will be explained in conjunction with FIG. 16 to FIG. 27.

Figure 16:
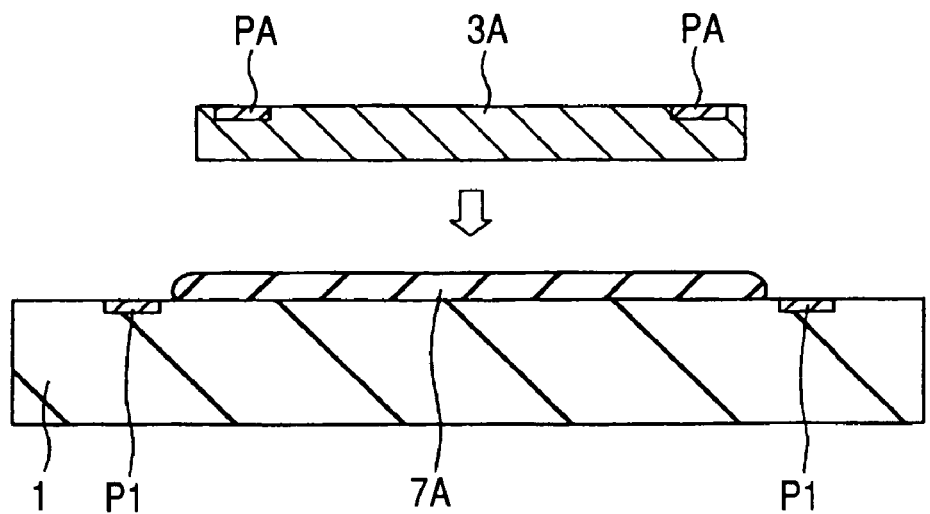
FIG. 16 is a cross-sectional view of a characteristic part showing a manufacturing step of a semiconductor device according to an embodiment 2 of the present invention.
Figure 17:
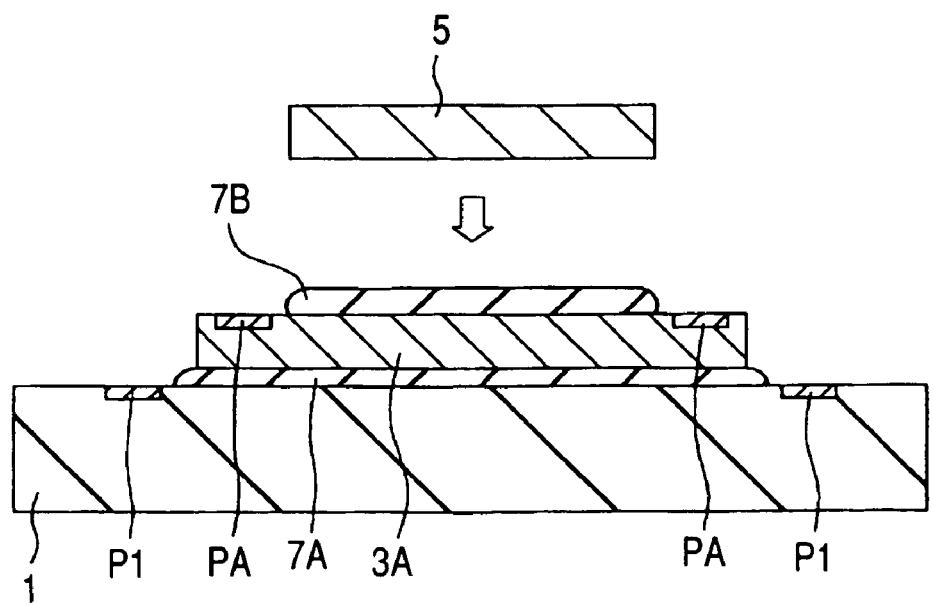
FIG. 17 is a cross-sectional view of a characteristic part showing a manufacturing step of the semiconductor device according to the embodiment 2 of the present invention.

As shown in FIG. 16, to the semiconductor chip mounting region of the mounting substrate 1, the adhesive material 7A is applied. This adhesive material 7A is made of resin in a paste form and having mainly a thermosetting property. Next, the semiconductor chip 3A is mounted on the adhesive material 7A; and, thereafter, as shown in FIG. 17, the adhesive material 7B is applied to a spacer chip mounting region of the semiconductor chip 3A. The properties and specific composition examples of these adhesive materials 7A, 7B are substantially equal to the properties and the specific composition example of the adhesive material 7 according to the embodiment 1.

Figure 18:
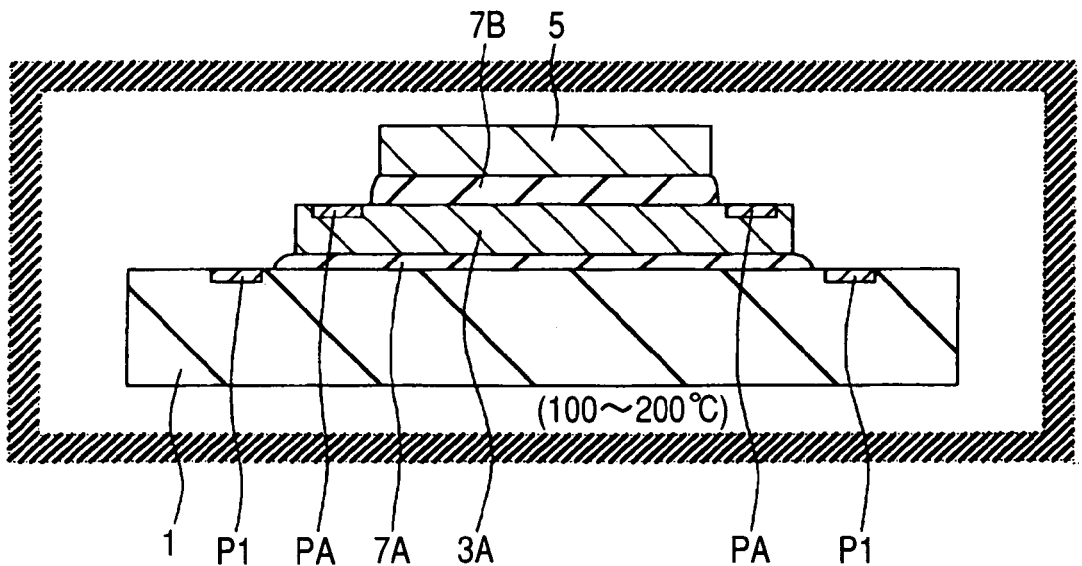
FIG. 18 is a cross-sectional view of a characteristic part showing a manufacturing step of the semiconductor device according to the embodiment 2 of the present invention.

Next, as shown in FIG. 18, by applying heat treatment to the mounting substrate 1 at a temperature of 100 to 200° C., for example, the adhesive materials 7A, 7B are cured. As a result, the semiconductor chip 3A is fixed to the mounting substrate 1 and the spacer chip 5 is fixed to the semiconductor chip 3A. Further, on an outer periphery of a semiconductor chip mounting region formed on the mounting substrate 1, pads P1 are exposed, while on an outer periphery of a spacer chip mounting region formed on the semiconductor chip 3a, pads PA are exposed.

Figure 19:
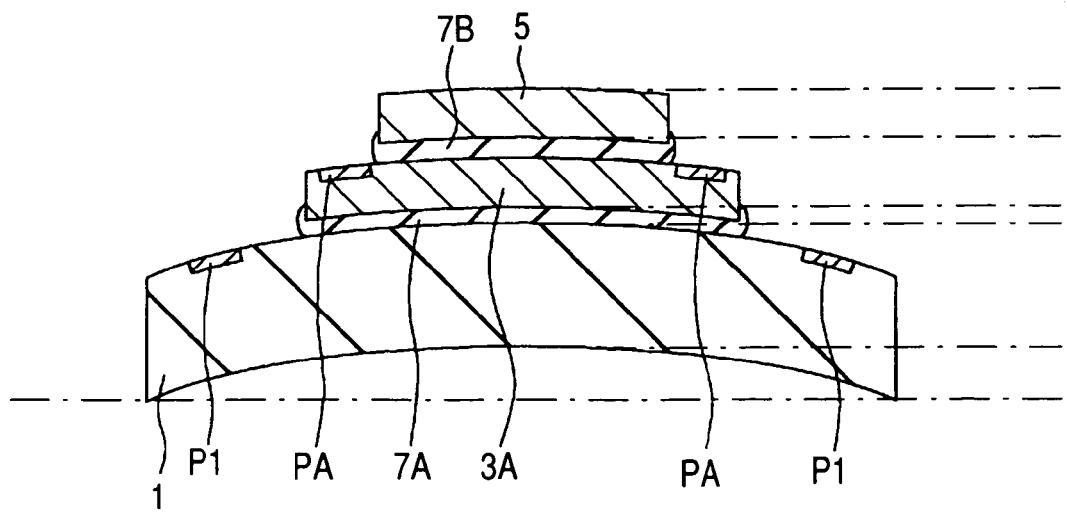
FIG. 19 is a cross-sectional view of a characteristic part showing a manufacturing step of the semiconductor device according to the embodiment 2 of the present invention.

Here, the mounting substrate 1 is held as it is and is cooled naturally to a normal temperature. In this cooling operation, the mounting substrate 1, the semiconductor chip 3A and the spacer chip 5 are respectively shrunken. However, the mounting substrate 1, the semiconductor chip 3A and the spacer chip 5 differ from each other in the α value thereof, and, hence, their shrinkage rates are different from each other. As a result, as shown in FIG. 19, the mounting substrate 1 warps in a convex shape.

Figure 20:
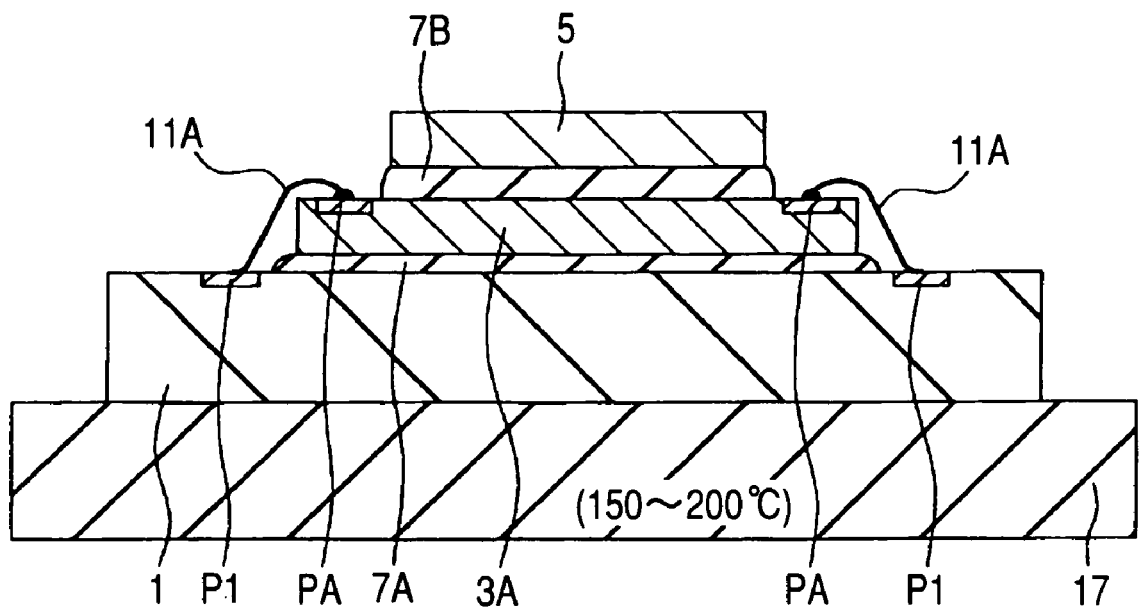
FIG. 20 is a cross-sectional view of a characteristic part showing a manufacturing step of the semiconductor device according to the embodiment 2 of the present invention.

Next, as shown in FIG. 20, the pads P1 formed over the mounting substrate 1 and the pad PA formed over the semiconductor chip 3A are connected to each other by wires 11A (first wire bonding). The first wire bonding is performed in the same manner as the first wire bonding performed in the embodiment 1.

Figure 21:
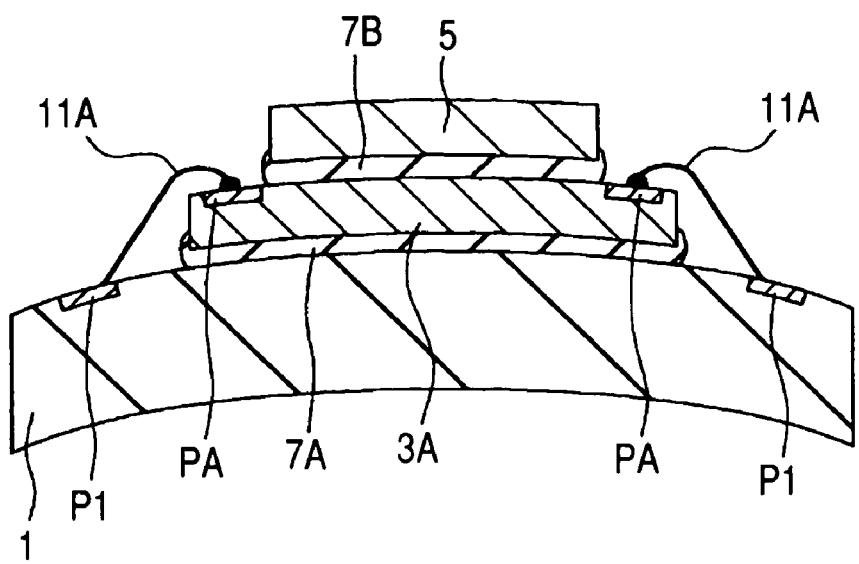
FIG. 21 is a cross-sectional view of a characteristic part showing a manufacturing step of the semiconductor device according to the embodiment 2 of the present invention.

Here, when the mounting substrate 1 is held as it is and is cooled naturally to a normal temperature, as show in FIG. 21, the mounting substrate 1 and the like again warp in a convex shape.

Figure 22:
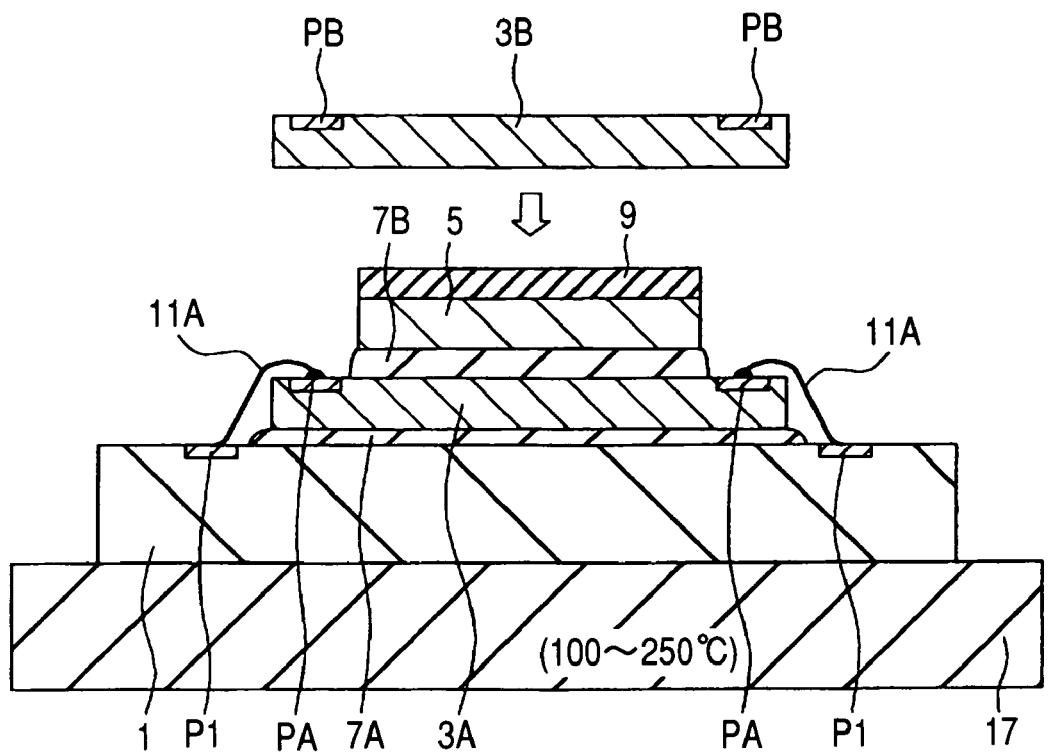
FIG. 22 is a cross-sectional view of a characteristic part showing a manufacturing step of the semiconductor device according to the embodiment 2 of the present invention.

Next, as shown in FIG. 22, the adhesive material 9 is laminated to the spacer chip 5 and the semiconductor chip 3B is bonded to an upper portion of the adhesive material 9 by thermo compression bonding processing in the same manner as the embodiment 1. That is, the mounting substrate 1 is mounted on a heating stage and is heated at a temperature of approximately 100 to 250° C. and, at the same time, the semiconductor chip 3B is pressed on the adhesive material 9 (spacer chip 5).

Here, the adhesive material 9 is made of resin having a thermoplastic property. Further, the adhesive material 9 is made of a film-like resin. The properties and a specific example of the composition of this adhesive material 9 are similar to the properties and the specific examples of the composition of the adhesive materials 9A, 9B used in the embodiment 1.

Figure 23:
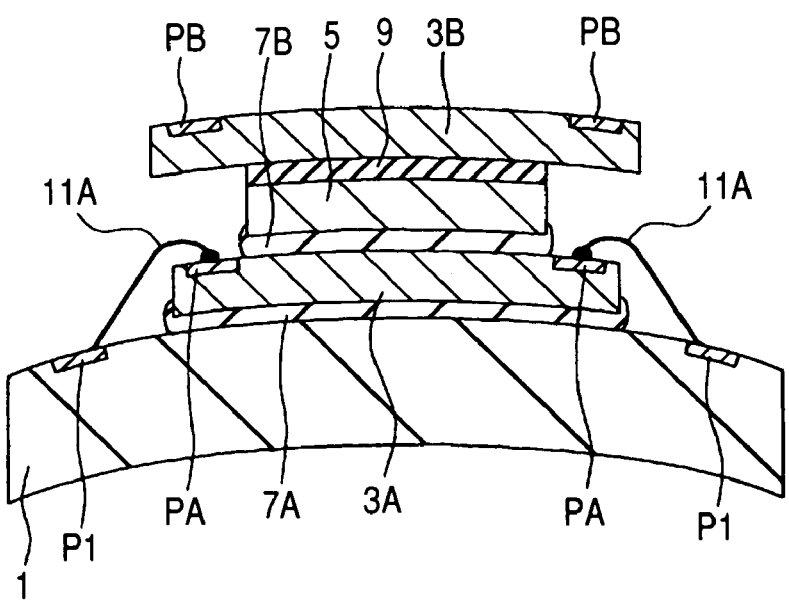
FIG. 23 is a cross-sectional view of a characteristic part showing a manufacturing step of the semiconductor device according to the embodiment 2 of the present invention.

Next, when the stacked structure is cooled naturally to a normal temperature, as shown in FIG. 23, the mounting substrate 1 and the like warp in a convex shape. Here, the pads PB are exposed from the outer peripheral portion of the semiconductor chip 3B.

Figure 24:
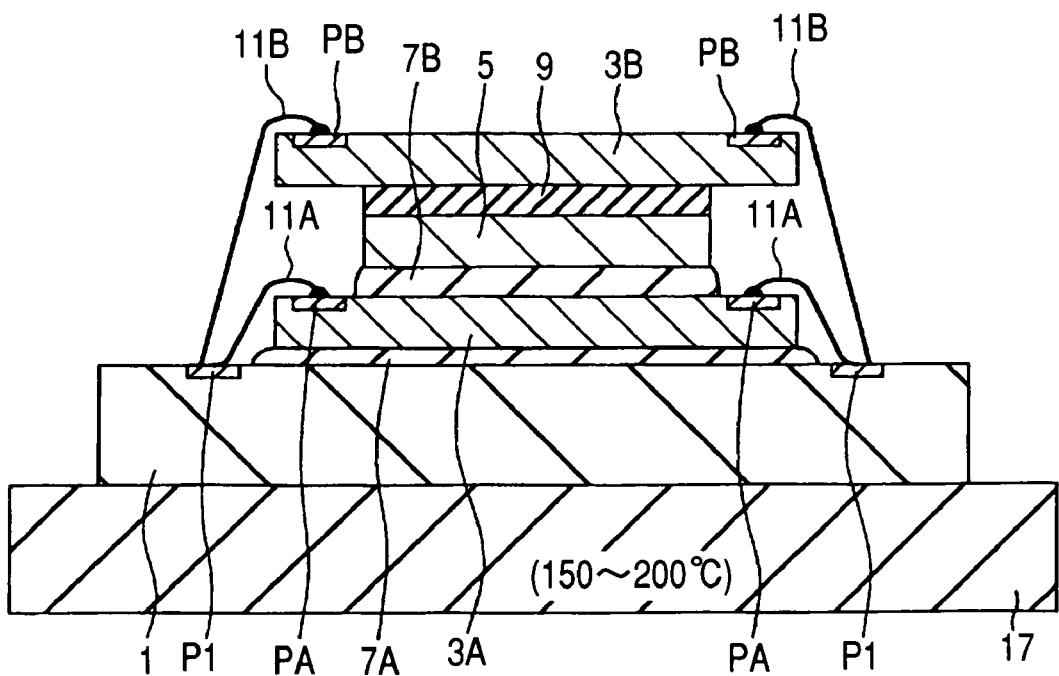
FIG. 24 is a cross-sectional view of a characteristic part showing a manufacturing step of the semiconductor device according to the embodiment 2 of the present invention.

Next, as shown in FIG. 24, the pads P1 formed over the mounting substrate 1 and the pad PB formed over the semiconductor chip 3B are connected to each other by wires 11B (second wire bonding). The second wire bonding is performed in the same manner as the second wire bonding performed in the embodiment 1.

Figure 25:
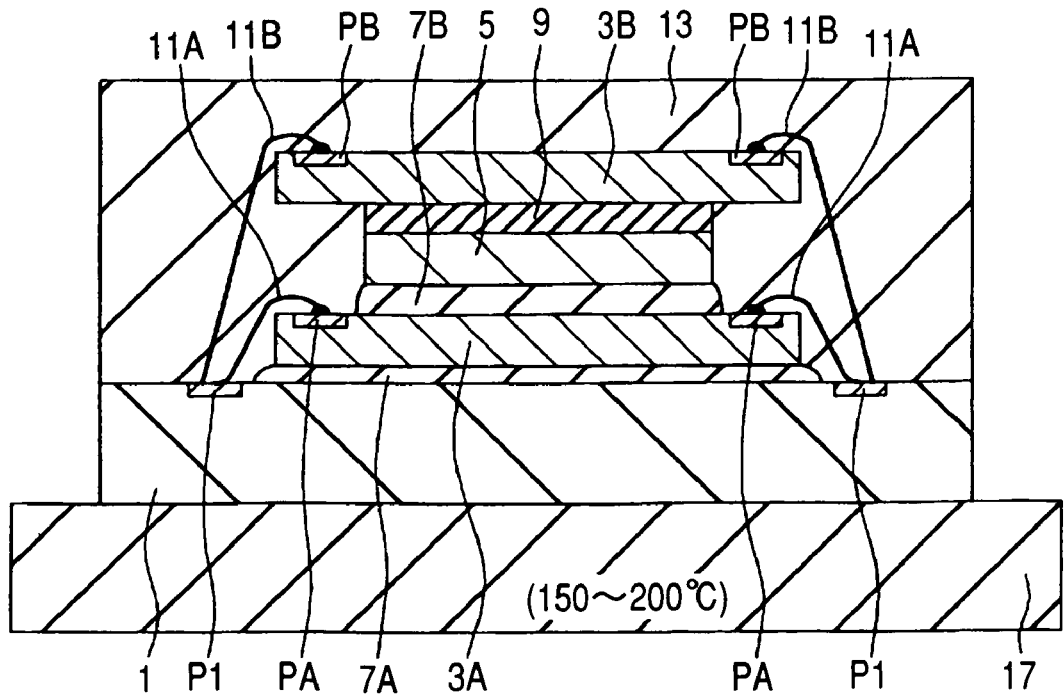
FIG. 25 is a cross-sectional view of a characteristic part showing a manufacturing step of the semiconductor device according to the embodiment 2 of the present invention.
Figure 26:
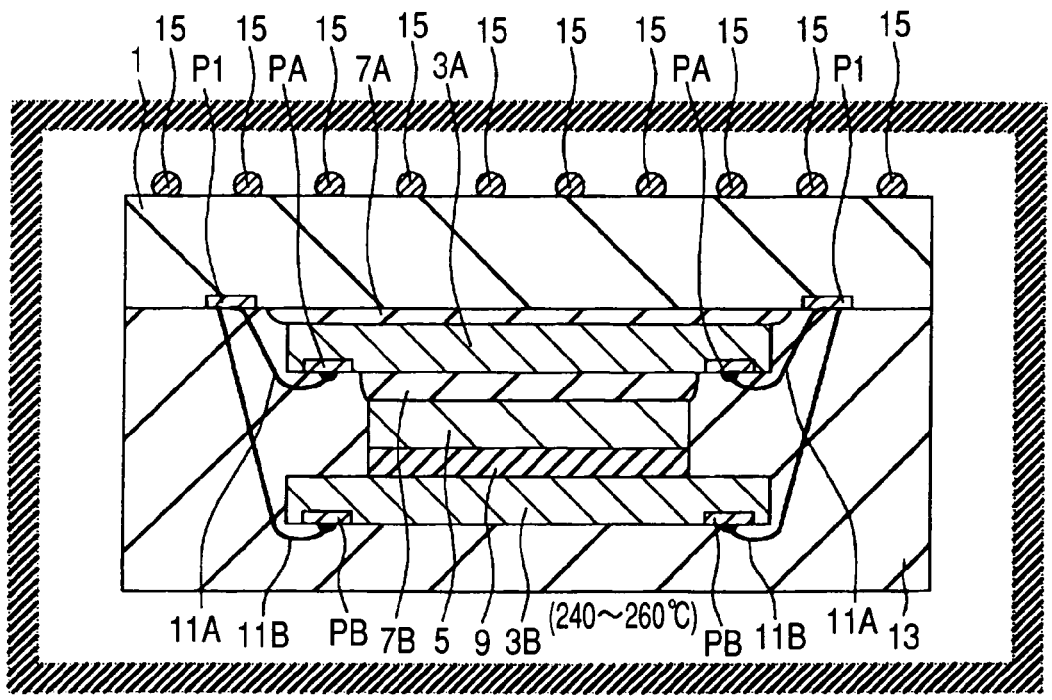
FIG. 26 is a cross-sectional view of a characteristic part showing a manufacturing step of the semiconductor device according to the embodiment 2 of the present invention.

Next, as shown in FIG. 25, in the same manner as the embodiment 1, the peripheries of the semiconductor chips 3A, 3B, the wires 11A, 11B, and the like, are sealed by mold resin 13; and, thereafter, as shown in FIG. 26, in the same manner as the embodiment 1, bump electrodes 15 are formed. Thereafter, the stacked structure is turned over to cause the surface on which the bump electrodes 15 are formed to be a lower side (FIG. 27), whereby the semiconductor device according to this embodiment is almost completed.

In this manner, according to this embodiment, in the same manner as the embodiment 1, directly above the mounting substrate, the adhesion (fixing) of the semiconductor chip, which is arranged above the mounting substrate, to the mounting substrate is performed using the resin in a paste form having a thermosetting property; and, thereafter, at the time of adhering the semiconductor chips which are stacked after the heat treatment for curing the above-mentioned resin, the film-like resin having a thermoplastic property is used. Accordingly, the adhesiveness of the respective chips can be enhanced. Further, the reliability and yield rate of the semiconductor device can be enhanced.

That is, in this embodiment, the first wire bonding is performed after the spacer chip is fixed, and, hence, resin in a paste form having a thermosetting property can be used also for fixing the spacer chip. Accordingly, the cost of the adhesive material can be reduced. Further, the heat treatment for fixing the spacer chip and the heat treatment for fixing the semiconductor chip which is disposed below the spacer chip can be performed simultaneously, and, hence, the steps can be simplified.

However, when the distance between an end portion of the spacer chip and the pads formed on the semiconductor chip which is disposed below the spacer chip is small, it is difficult to perform the wire bonding after the spacer chip is fixed. In such a case, it is desirable that, in the same manner as the embodiment 1, the spacer chip is fixed after conducting the first wire bonding.

Embodiment 3

In the above-mentioned embodiments 1 and 2, a spacer chip is used. However, in this embodiment, the use of the spacer chip is eliminated by properly designing the shape of the semiconductor chips which are stacked.

FIG. 28 to FIG. 32 are cross-sectional views of characteristic parts showing steps in the manufacture of a semiconductor device according to this embodiment. This embodiment will be explained in conjunction with the drawings hereinafter. Here, the same or relevant symbols are given to parts that are identical to the parts of the embodiment 1, and a repeated explanation thereof is omitted. Further, with respect to the steps (processes) similar to the steps of the embodiment 1, a repeated explanation thereof is also omitted.

First of all, the constitution of the semiconductor device according to this embodiment will be explained. Here, since the structure is clarified more in the explanation of the steps employed in the manufacture of the semiconductor device of this embodiment, to be described later, only the main constitution will be explained here.

Figure 32:
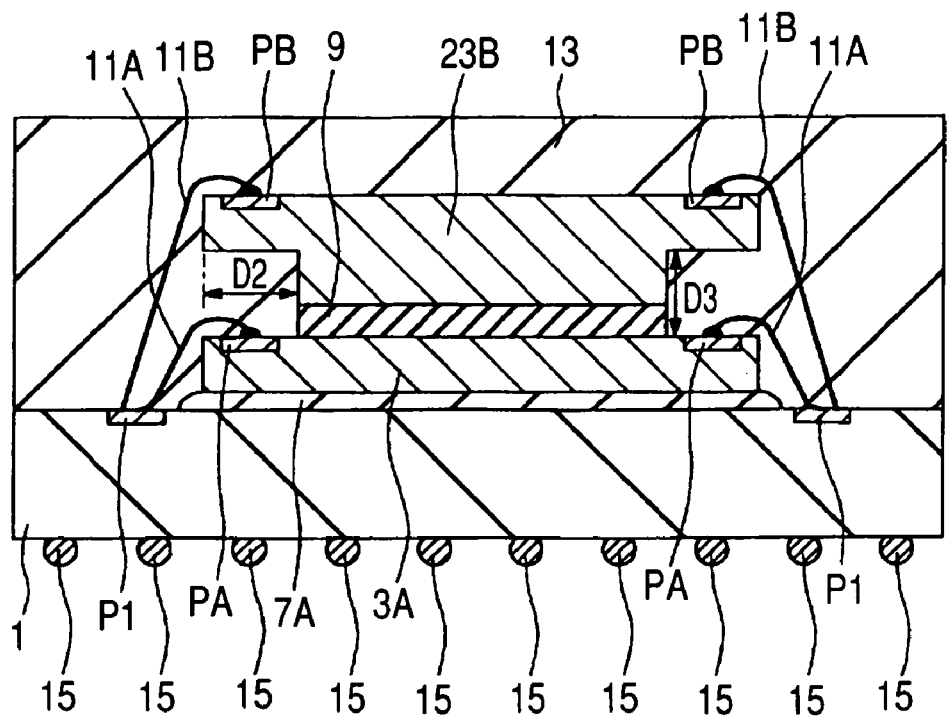
FIG. 32 is a cross-sectional view of a characteristic part showing a manufacturing step of the semiconductor device according to the embodiment 3 of the present invention.

As shown in FIG. 32, which shows a final step, in the manufacture of the semiconductor device of this embodiment, on a main surface of a mounting substrate 1, two semiconductor chips 3A, 23B are mounted. Of the two semiconductor chips, the semiconductor chip 23B has an inversely projecting shape. In other words, the semiconductor chip 23B has a projecting portion at a center portion of a lower surface (a back surface, an adhesion surface, a surface at a side opposite to a die forming surface) thereof. Further, a cutout portion is formed in an outer peripheral portion of the lower surface of the semiconductor chip 23B. By forming such a cutout portion, it is possible to ensure a space on the outer peripheral portion of the semiconductor chip 3A, whereby a short-circuiting between the wires 11A and the semiconductor chip 23B can be prevented. With respect to the cutout portion of the semiconductor chip 23B, the length D2 thereof in the lateral direction is approximately 200 to 500 µm and the length D3 thereof in the longitudinal direction is approximately 100 to 300 µm.

Here, the mounting substrate 1 and the semiconductor chip 3A are fixed to each other by way of the adhesive material 7 and the semiconductor chip 3A and the semiconductor chip 23B are fixed by way of the adhesive material 9. The adhesive material 7 is made of a resin having mainly a thermosetting property, for example. Further, the adhesive material 9 is made of a resin having a thermoplastic property, for example.

In this manner, according to this embodiment, the adhesive material of the semiconductor chip 3A, which is mounted on the mounting substrate 1, and the adhesive material of the semiconductor chip 23B, which is mounted on the semiconductor chip 3A, are different from each other, and, hence, their adhesiveness can be enhanced.

Further, with the use of the semiconductor chip 23B having an inversely projecting shape, as will be explained in more detail later, it is possible to reduce the thickness of the semiconductor device, and, at the same time, it is possible to simplify the manufacturing steps. Further, the spacer chip can be omitted, and, hence, the manufacturing cost can be reduced.

Next, a method (assembling steps) of manufacture of the semiconductor device according to this embodiment will be explained in conjunction with FIG. 28 to FIG. 32.

First of all, as explained in conjunction with FIG. 1 to FIG. 4 in connection with the embodiment 1, to the semiconductor chip mounting region formed on the mounting substrate 1, the semiconductor chip 3A is fixed by way of the adhesive material 7. That is, the adhesive material 7 is applied to the mounting substrate 1, and, thereafter, the semiconductor chip 3A is mounted on the adhesive material 7. Then, heat treatment is applied to the stacked structure so as to cure the adhesive material 7. The adhesive material 7 is formed of resin in a paste form having mainly a thermosetting property. Further, the properties and the specific example of the composition of the adhesive material 7 are exactly as same as those explained in connection with the embodiment 1.

Further, in the same manner as in the embodiment 1, the pads P1 formed over the mounting substrate 1 and the pad PA formed over the semiconductor chip 3A are connected to each other by the wires 11A (first wire bonding) (see FIG. 5). Next, when the mounting substrate 1 is held as it is and is cooled naturally to a normal temperature, as explained in connection with the embodiment 1, the mounting substrate 1 and the like warp in a convex shape (see FIG. 6).

Figure 28:
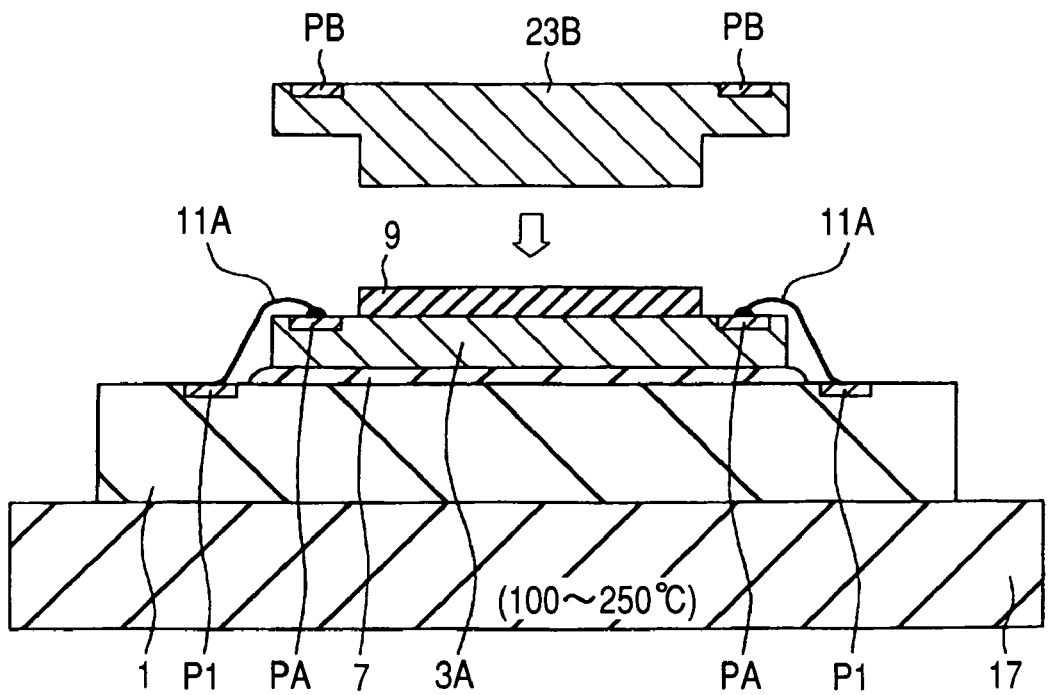
FIG. 28 is a cross-sectional view of a characteristic part showing a manufacturing step of a semiconductor device according to an embodiment 3 of the present invention.

Further, as shown in FIG. 28, the adhesive material 9 is laminated to the semiconductor chip 3A and the semiconductor chip 23B is bonded to the adhesive material 9 by thermo compression bonding processing. As described above, the semiconductor chip 23B has an inversely projecting shape. The projecting portion formed on the lower surface of the semiconductor chip 23B is adhered to the semiconductor chip 3A. Here, a method of forming the semiconductor chip having an inversely projecting shape will be described later.

That is, in the same manner as the semiconductor chip 3B used in the embodiment 1, the mounting substrate 1 is mounted on a heating stage and, thereafter, the semiconductor chip 23B is pressed on the adhesive material 9 (semiconductor chip 3A) in a state such that the mounting substrate 1 is heated at a temperature of approximately 100 to 250° C.

Here, the adhesive material 9 is made of a resin having a thermoplastic property and is also made of a film-like resin. Properties and a specific example of the composition of the adhesive material 9 are similar to the properties and the specific example of the composition of the adhesive materials 9A, 9B used in the embodiment 1.

Next, when the stacked structure is cooled naturally to a normal temperature, the mounting substrate 1 and the like warp in a convex shape. Here, the pads PB are exposed from an outer peripheral portion of the semiconductor chip 23B.

Figure 29:
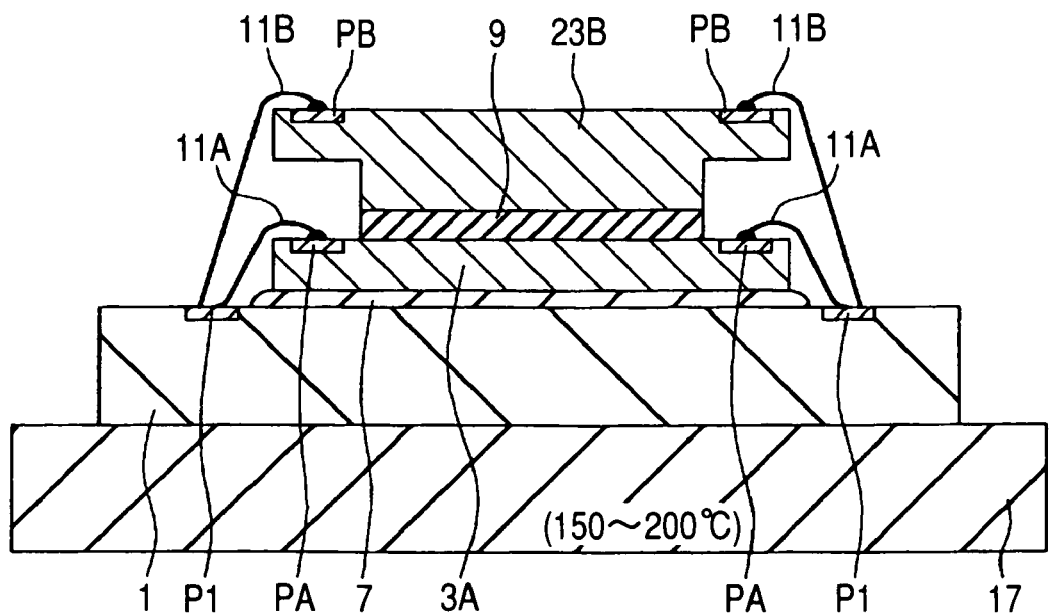
FIG. 29 is a cross-sectional view of a characteristic part showing a manufacturing step of the semiconductor device according to the embodiment 3 of the present invention.

Next, as shown in FIG. 29, the pads P1 formed over the mounting substrate 1 and the pad PB formed over the semiconductor chip 23B are connected to each other by the wires 11B (second wire bonding). The second wire bonding is performed in substantially the same manner as the second wire bonding performed in the embodiment 1.

Figure 30:
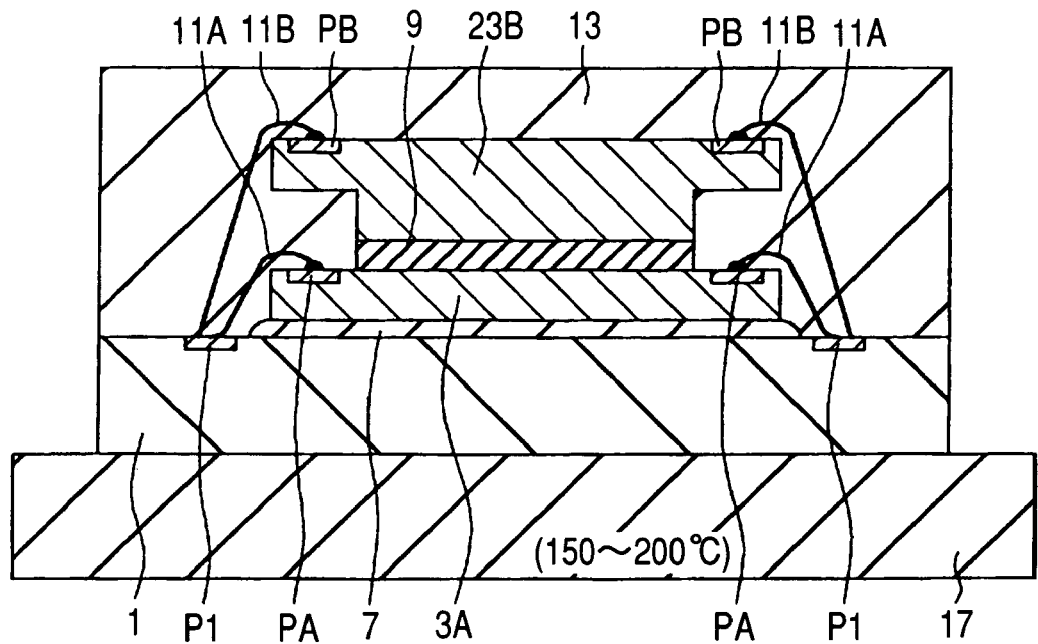
FIG. 30 is a cross-sectional view of a characteristic part showing a manufacturing step of the semiconductor device according to the embodiment 3 of the present invention.
Figure 31:
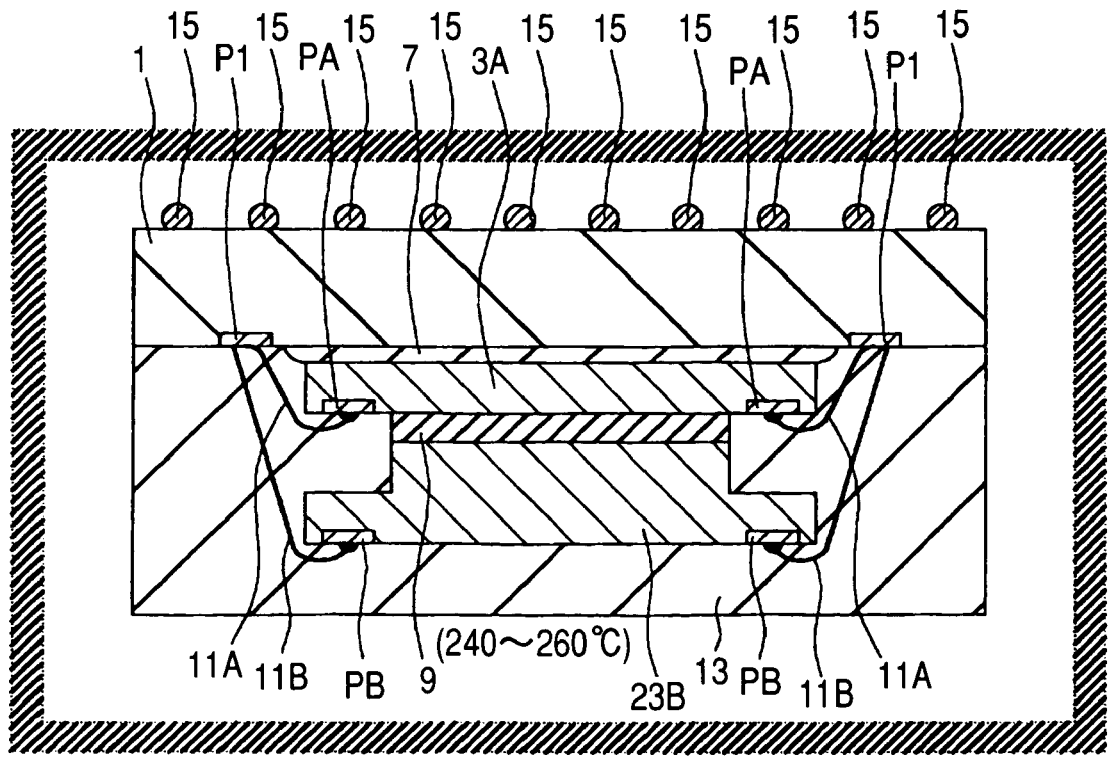
FIG. 31 is a cross-sectional view of a characteristic part showing a manufacturing step of the semiconductor device according to the embodiment 3 of the present invention.

Next, as shown in FIG. 30, in the same manner as the embodiment 1, the peripheries of the semiconductor chips 3A, 23B, the wires 11A, 11B and the like are sealed by mold resin 13, and, thereafter, as shown in FIG. 31, the bump electrode 15 is formed in the same manner as the embodiment 1. Thereafter, by turning over the stacked structure to cause the surface on which the bump electrodes 15 are formed to appear a lower surface (FIG. 32), the semiconductor device according to this embodiment is almost completed.

In this manner, according to this embodiment, in the same manner as the embodiment 1, directly above the mounting substrate, the adhesion (fixing) of the semiconductor chip, which is arranged above the mounting substrate, to the mounting substrate is performed using resin in a paste form having a thermosetting property, and, thereafter, at the time of adhering the semiconductor chips (semiconductor chips and spacer chips) which are stacked after the heat treatment for curing the above-mentioned resin, the film-like resin having a thermoplastic property is used. Accordingly, the adhesiveness of the respective chips can be enhanced. Further, the reliability and a yield rate of the semiconductor device can be enhanced.

Further, according to this embodiment, with the use of the semiconductor chip having an inversely projecting shape, it is possible to eliminate the spacer chip, which is employed in conjunction with the embodiment 1 or the embodiment 2. Accordingly, the adhesion step of the spacer chip can be omitted, and, hence, the manufacturing steps can be simplified.

Further, without regard to the thickness of the spacer chip, it is possible to adjust the height of the projecting portion (D3 in FIG. 32), and, hence, the thickness of the semiconductor device can be reduced (miniaturization). That is, the height of the projecting portion can be set to a required minimum value which is determined by taking the loop height of the wires 11A into consideration, and, hence, the thickness of the semiconductor device can be reduced (miniaturization).

Next, a method of forming the semiconductor chip having an inversely projecting shape will be explained in conjunction with FIG. 33 to FIG. 39.

Figure 33:
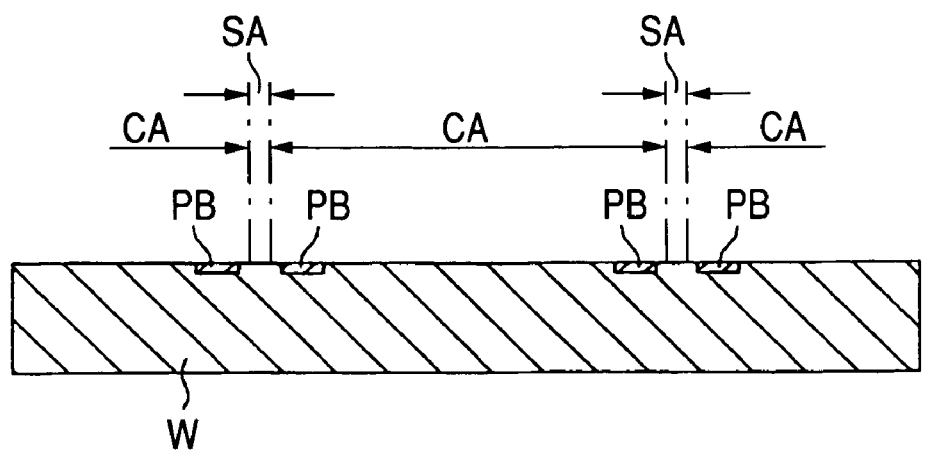
FIG. 33 is a cross-sectional view of a characteristic part showing a method of forming a semiconductor chip having an inversely projecting shape which is used in the embodiment 3 of the present invention.

First of all, as shown in FIG. 33, a semiconductor wafer W is prepared. The semiconductor wafer W has an approximately circular shape, for example, and a large number of rectangular chip regions CA are arranged thereon. The respective chip regions are defined by scribe regions SA. Usually, by dicing the semiconductor wafer W along these scribe regions SA, a plurality of semiconductor chips (pellets) are formed. Here, in FIG. 33 and the like, only the regions which correspond to approximately two pieces of semiconductor chips are displayed. On a main surface of the semiconductor wafers W, semiconductor dies not shown in the drawing are formed and pads PB are exposed from the surface.

Figure 34:
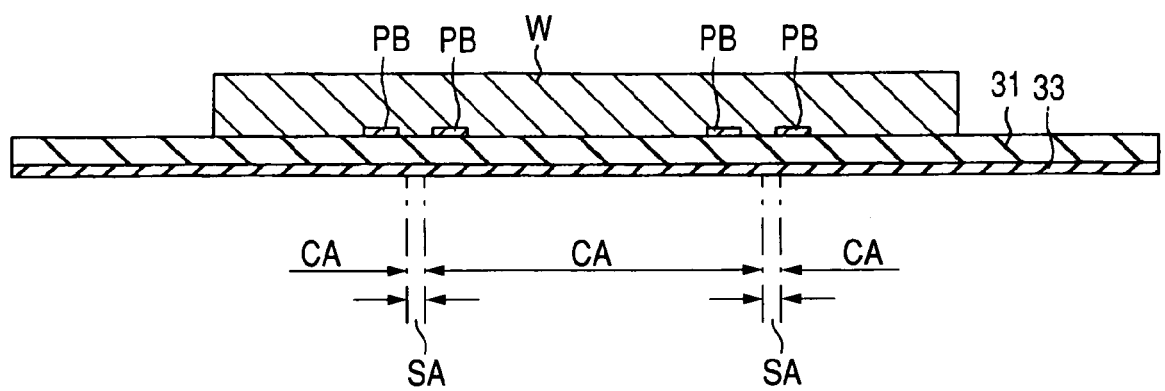
FIG. 34 is a cross-sectional view of a characteristic part showing the method for forming the semiconductor chip having an inversely projecting shape which is used in the embodiment 3 of the present invention.
Figure 35:
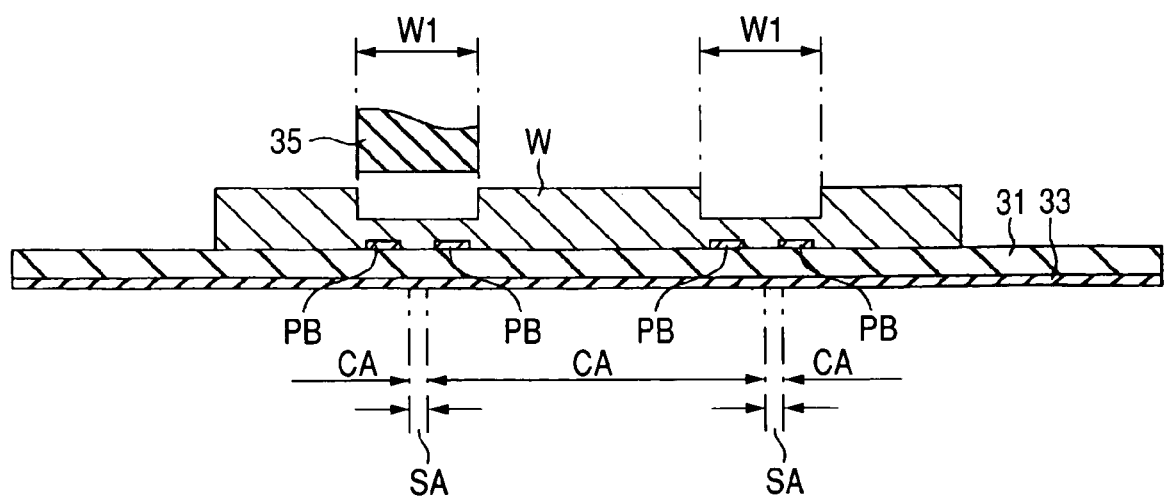
FIG. 35 is a cross-sectional view of a characteristic part showing the method for forming the semiconductor chip having an inversely projecting shape which is used in the embodiment 3 of the present invention.

As shown in FIG. 34, a back grind (BG) tape 31 and a dicing tape 33 are sequentially laminated to a pad PB forming surface, wherein back surface grinding (BG) is performed in a state in which a tape adhering surface assumes a lower side. Then, as shown in FIG. 35, a region having a width W1, which includes the subscribe region SA, is diced using a dicing saw having a wide width until a dicing depth reaches a mid depth portion (for example, 100 to 300 µm) of the semiconductor wafer W (first dicing).

Figure 36:
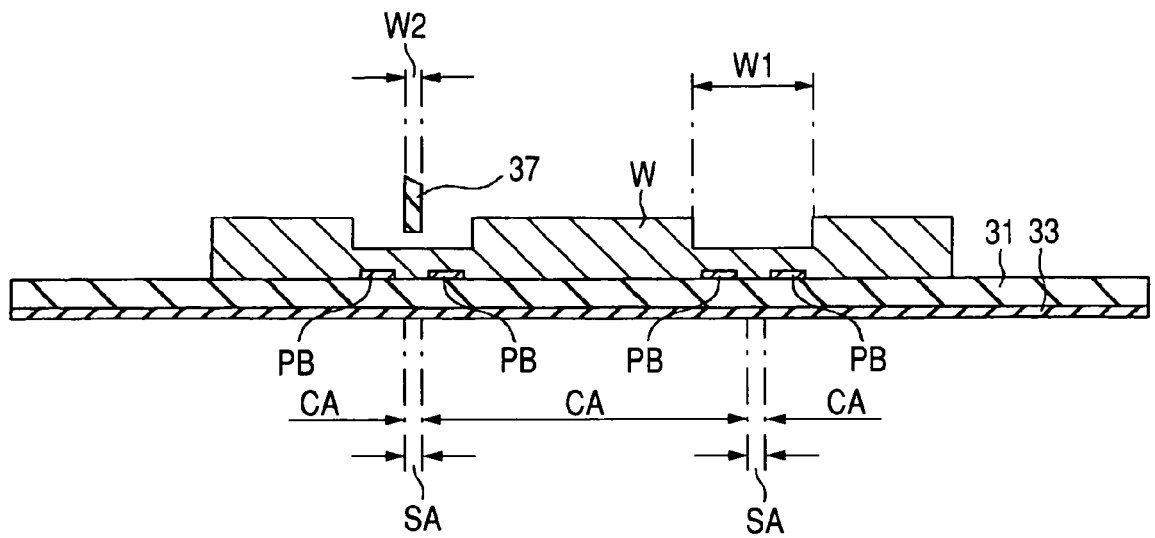
FIG. 36 is a cross-sectional view of a characteristic part showing the method for forming the semiconductor chip having an inversely projecting shape which is used in the embodiment 3 of the present invention.

Next, as shown in FIG. 36, the scribe region SA (width W2), which is positioned at an approximately center portion of the region having the width W1, is diced by a dicing saw 37 having a narrow width until the dicing depth reaches the surface of the semiconductor wafer W (second dicing). The width W2 is smaller than the width W1.

Figure 37:
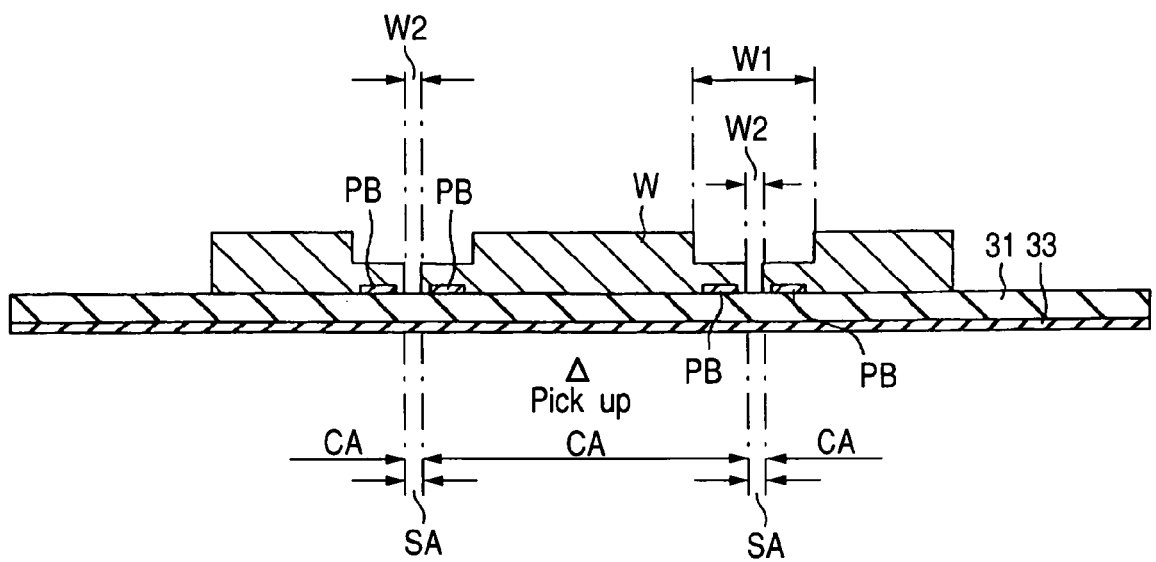
FIG. 37 is a cross-sectional view of a characteristic part showing the method for forming the semiconductor chip having an inversely projecting shape which is used in the embodiment 3 of the present invention.
Figure 38:
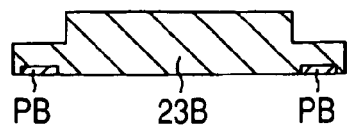
FIG. 38 is a cross-sectional view of a characteristic part showing the method for forming the semiconductor chip having an inversely projecting shape which is used in the embodiment 3 of the present invention.
Figure 39:
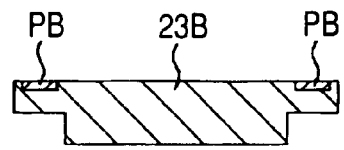
FIG. 39 is a cross-sectional view of a characteristic part showing the method for forming the semiconductor chip having an inversely projecting shape which is used in the embodiment 3 of the present invention.

Next, as shown in FIG. 37, a chip region CA is pushed up from the tape adhering surface side using a needle or the like and, at the same time, an upper surface of the chip region CA is picked up using a suction collet or the like. As a result, as shown in FIG. 38, a semiconductor chip 23B is formed, having the projecting portion at the center portion of the back surface (the upper surface in FIG. 38) and having the cutout portion on the outer peripheral portion. Here, when the semiconductor chip 23B is stacked in the inside of the semiconductor device, as shown in FIG. 39, the semiconductor chip 23B is adhered such that the projecting portion side assumes a lower side.

Next, another method for forming the semiconductor chip having an inversely projecting shape will be explained in conjunction with FIG. 40 to FIG. 42.

Figure 40:
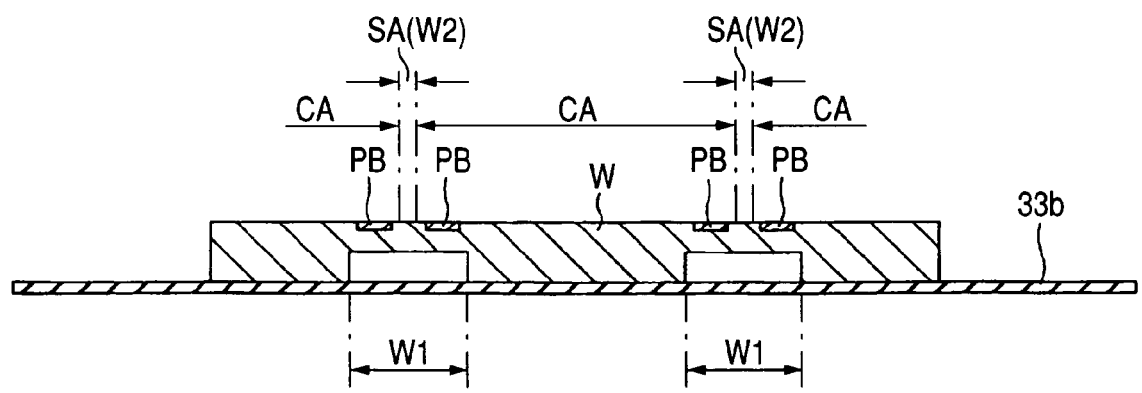
FIG. 40 is a cross-sectional view of a characteristic part showing another method for forming the semiconductor chip having an inversely projecting shape which is used in the embodiment 3 of the present invention.

After completion of the first dicing shown in FIG. 35, the back grind (BG) tape 31 and the dicing tape 33 on the pad PB forming surface (front surface) of the semiconductor wafer W are peeled off, and, as shown in FIG. 40, a dicing tape 33b is laminated to the back surface of the semiconductor wafer W.

Figure 41:
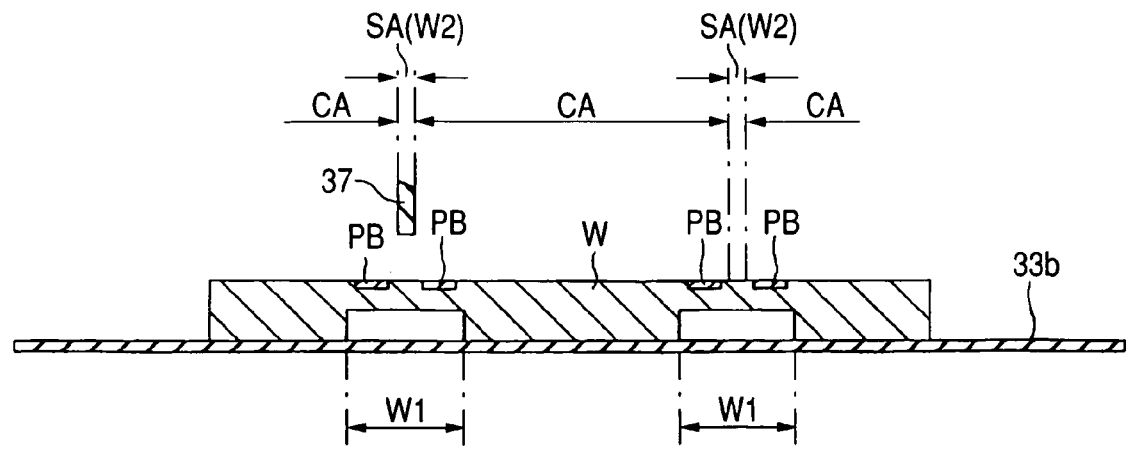
FIG. 41 is a cross-sectional view of a characteristic part showing another method for forming the semiconductor chip having an inversely projecting shape which is used in the embodiment 3 of the present invention.
Figure 42:
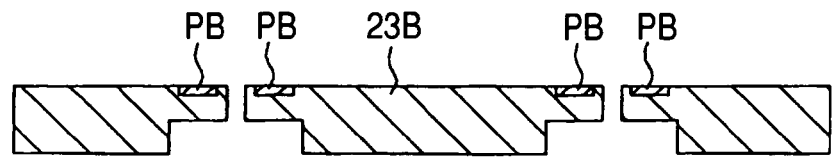
FIG. 42 is a cross-sectional view of a characteristic part showing another method for forming the semiconductor chip having an inversely projecting shape which is used in the embodiment 3 of the present invention.

Thereafter, as shown in FIG. 41, the scribe region SA (width W2), which is positioned at a substantially center portion of the region having the width W1, is diced from the pad PB forming surface (front surface) using a dicing saw 37 having a small width (second dicing). The width W2 is smaller than the width W1.

Next, a chip region CA is pushed up from the adhering surface side of the dicing tape 33b using a needle or the like, and, at the same time, an upper surface of the chip region CA is picked up using a suction collet or the like. Using such a method, it is also possible to form the semiconductor chip 23B, which was described in conjunction with FIG. 38 and has the projecting portion at the center portion of the back surface (the upper surface in FIG. 38) and the cutout portion on the outer peripheral portion (FIG. 42).

Figure 43:
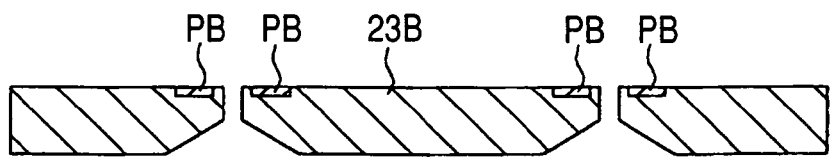
FIG. 43 is a cross-sectional view of a characteristic part showing the method for forming the semiconductor chip having an inversely projecting shape which is used in the embodiment 3 of the present invention.
Figure 45:
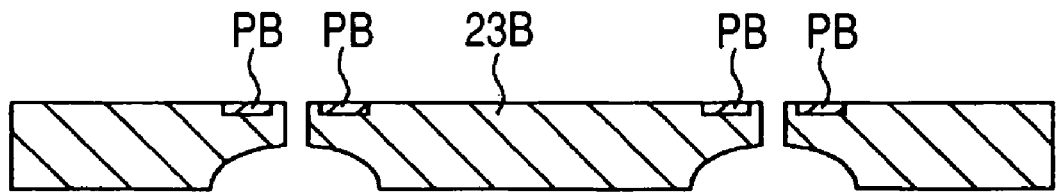
FIG. 45 is a cross-sectional view of a characteristic part showing another method for forming the semiconductor chip having an inversely projecting shape which is used in the embodiment 3 of the present invention.

Here, in this embodiment, the explanation has been given with respect to a semiconductor chip having a substantially rectangular cutout portion. However, as shown in FIG. 43, the cutout portion may be formed in a tapered shape. Further, as shown in FIG. 45, the cutout portion may be formed in a round shape. The semiconductor chips having these shapes can be formed by making the shape of the distal end of the dicing saw having the wide width conform to the shape of the cutout portion, for example. Here, also with respect to the steps for forming the semiconductor chip having such shapes, the second dicing may be conducted from the pad PB forming surface (front surface) or from the back surface (see FIG. 41 and FIG. 36). Here, FIG. 43 and FIG. 45 are cross-sectional views of a characteristic part for explaining the method for forming another semiconductor chip having an inversely projecting shape.

Figure 44:
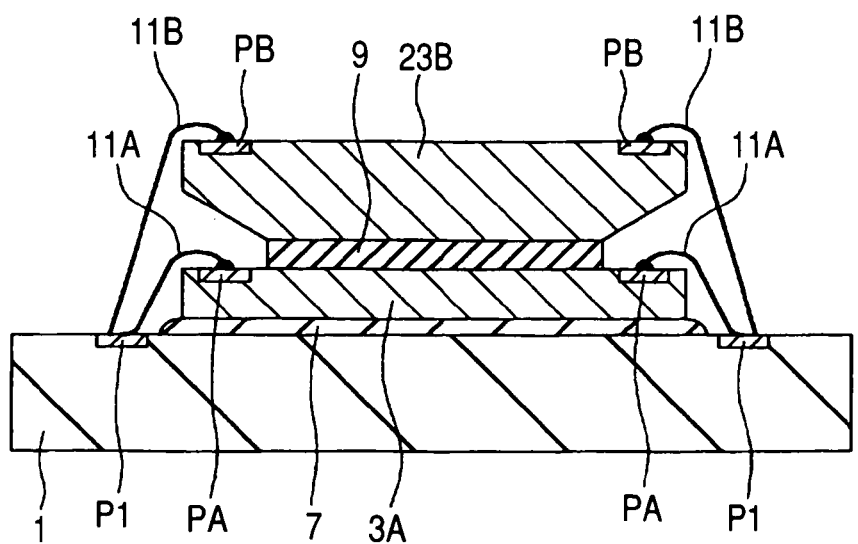
FIG. 44 is a cross-sectional view of a characteristic part of the semiconductor device which uses a semiconductor chip having a cutout portion in a tapered shape.
Figure 46:
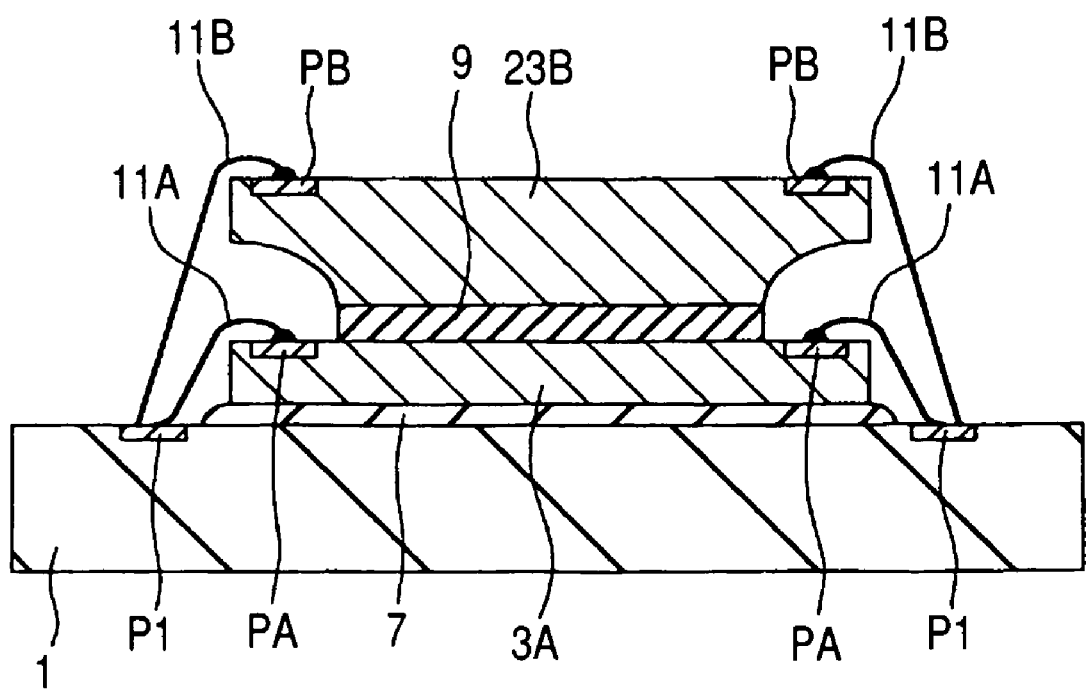
FIG. 46 is a cross-sectional view of a characteristic part of a semiconductor device which uses a semiconductor chip having a cutout portion in a round shape.

Further, FIG. 44 is a cross-sectional view of a characteristic part showing a case in which the semiconductor chip having the cutout portion in a tapered shape is used as the semiconductor chip 23B described in connection with this embodiment, and FIG. 46 is a cross-sectional view of a characteristic part showing a case in which the semiconductor chip having the cutout portion in a round shape is used as the semiconductor chip 23B described in connection with this embodiment. Except for the shape of the semiconductor chip mounted on the semiconductor device, the constitution and manufacturing steps are substantially the same as the constitution and manufacturing steps of the previously-mentioned embodiment, and, hence, a detailed explanation thereof is omitted. Here, in these drawings, the illustration of the mold resin 13 and the bump electrodes 15 is omitted.

Embodiment 4

In the embodiment 1 and the like, two semiconductor chips 3A, 3B having substantially the same shape are stacked. However, as explained hereinafter, this embodiment is effectively applicable to a case in which, irrespective of the shapes of the chips, a semiconductor chip which constitutes an upper layer is arranged such that the upper-layer semiconductor chip partially overlaps some pads of a semiconductor chip which constitutes a lower layer.

Figure 47:
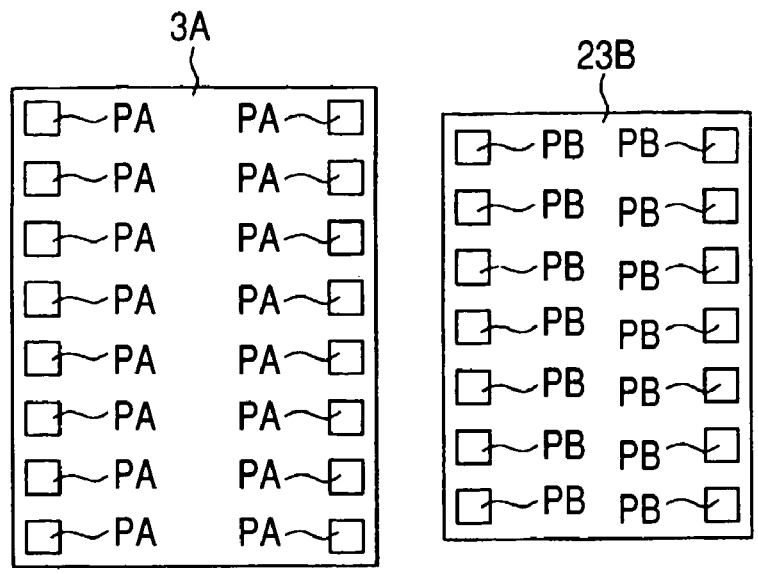
FIG. 47 is a plan view of a characteristic part showing a semiconductor device according to an embodiment 4 of the present invention.
Figure 48:
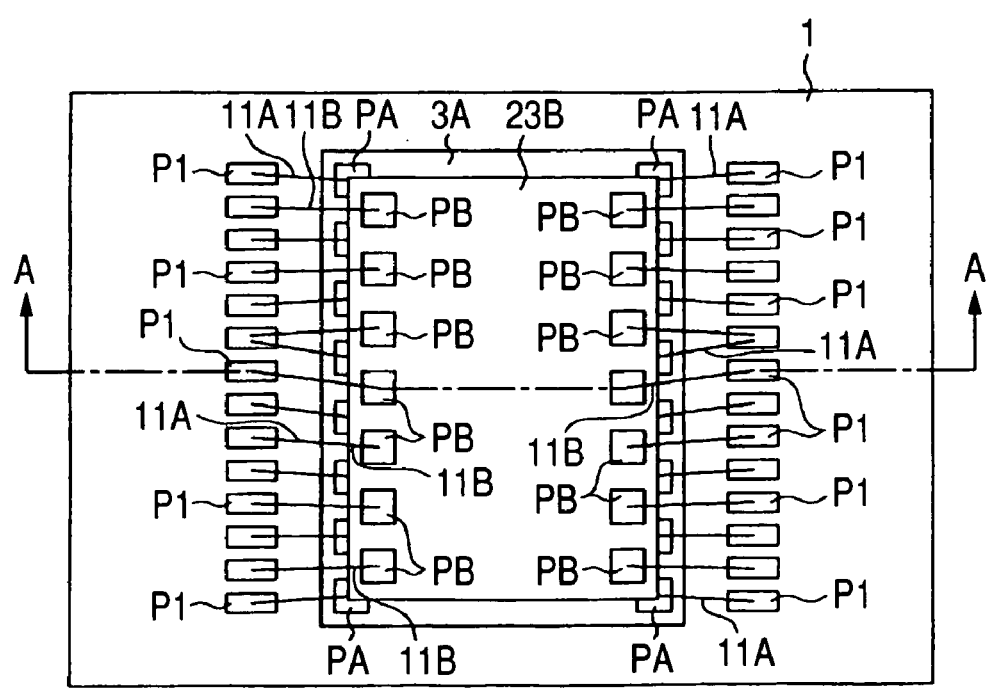
FIG. 48 is a plan view of a characteristic part showing the semiconductor device according to the embodiment 4 of the present invention.
Figure 49:
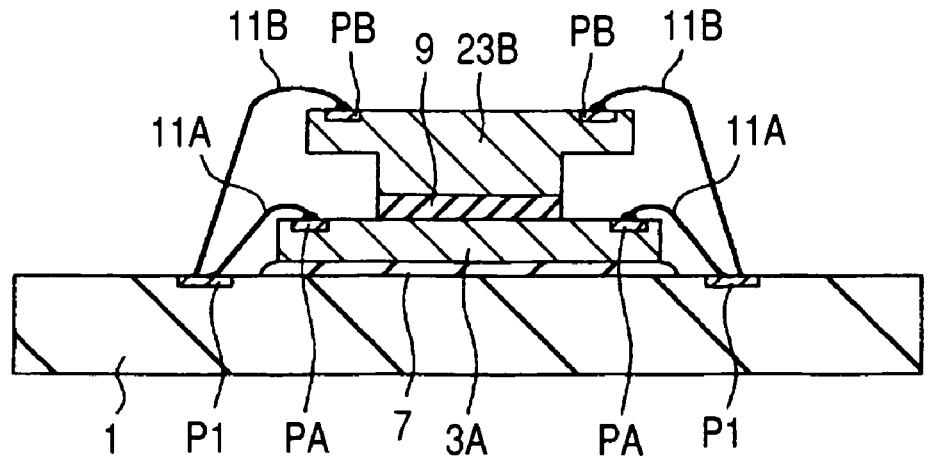
FIG. 49 is a cross-sectional view of a characteristic part showing the semiconductor device according to the embodiment 4 of the present invention.

FIG. 47 and FIG. 48 are plan views of showing the semiconductor device of this embodiment and FIG. 49 is a cross-sectional view part showing the semiconductor device of this embodiment. FIG. 49 corresponds to a cross-section taken along a line A—A in FIG. 48, for example.

The semiconductor chips 3A, 23B shown in FIG. 47 are stacked as shown in FIG. 48 and FIG. 49. The semiconductor chip 3A is slightly larger than the semiconductor chip 23B and the semiconductor chip 23B has an inversely projecting shape which has been explained in detail in conjunction with the embodiment 3. Also, in the semiconductor device having such a structure, the pads PA of the semiconductor chip 3A and the semiconductor chip 23B overlap each other, and, hence, it is necessary to perform bonding of the wires 11A before stacking the semiconductor chip 23B which constitutes the upper layer. That is, before stacking the semiconductor chip 23B, it is necessary to perform the heat treatment for fixing the semiconductor chip 3A which constitutes the lower layer using a resin.

As explained in conjunction with the embodiment 3 or the like, to an upper surface of a mounting substrate 1, using resin in a paste form having a thermosetting property (adhesive material 7), the semiconductor chip 3A, which is disposed above the mounting substrate 1, is adhered (fixed). Then, at the time of adhering the semiconductor chip 23B after conducting the heat treatment for curing the above-mentioned resin, using resin in a film form having a thermoplastic property (adhesive material 9), the adhesiveness of the respective chips can be enhanced. Further, this enhances the reliability and yield rate of the semiconductor device.

Here, the constitution and the method of manufacture of the semiconductor device shown in FIG. 49 or the like are substantially the same as those in the embodiment 3, and, hence, the same symbols are given to corresponding parts and a detailed explanation of the parts is omitted. Further, also in the drawing, the illustration of the mold resin 13 and the bump electrodes 15 is omitted.

Figure 50:
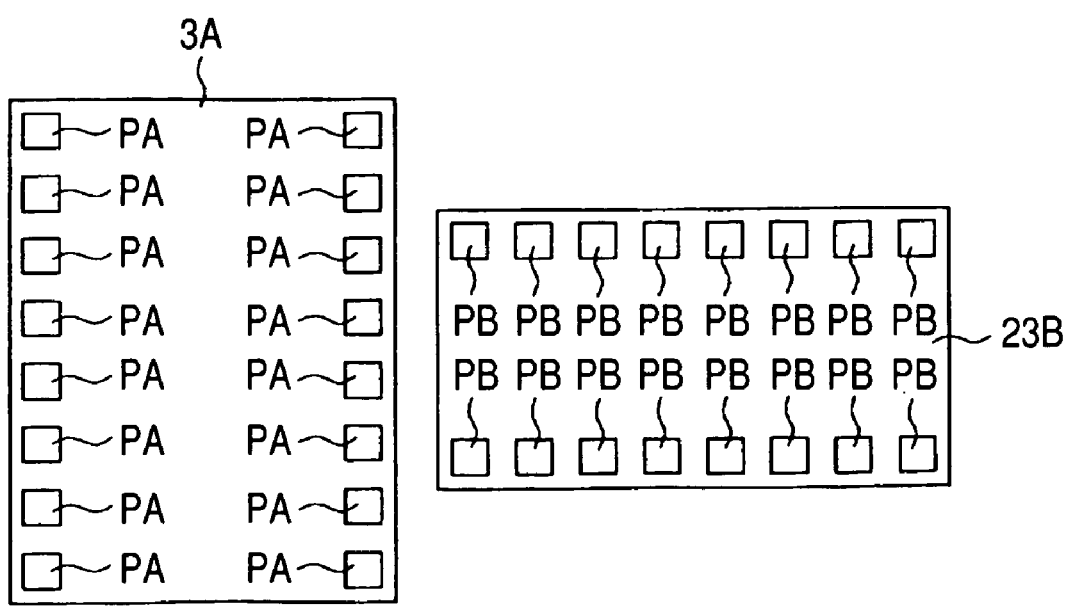
FIG. 50 is a plan view of a characteristic part showing another semiconductor device according to the embodiment 4 of the present invention.
Figure 51:
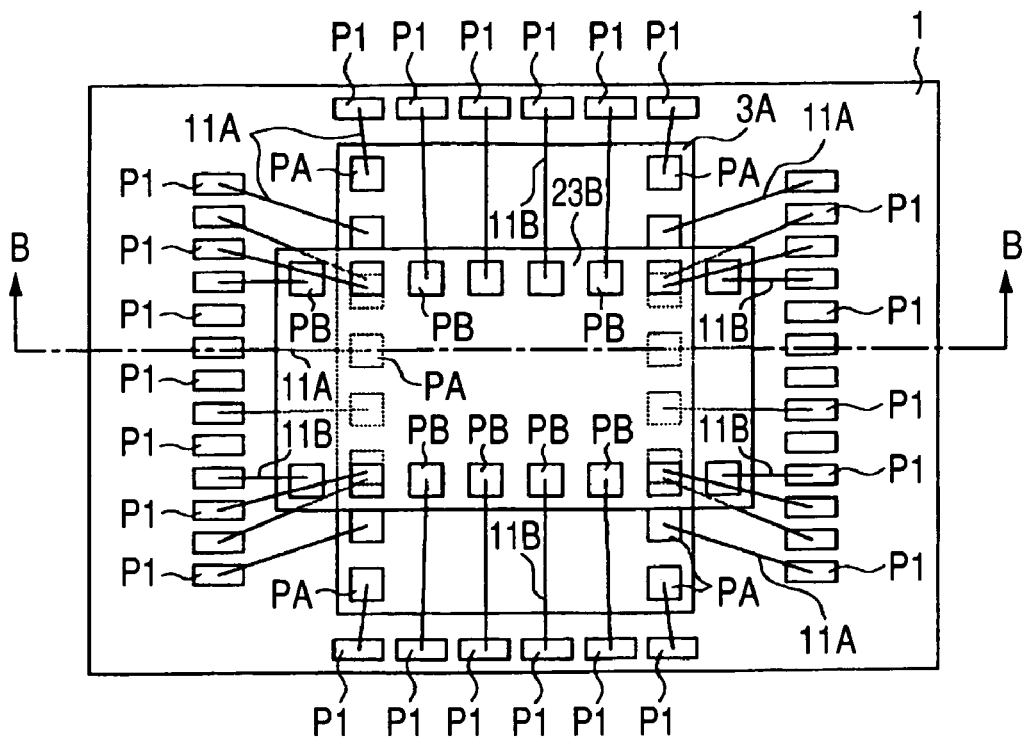
FIG. 51 is a plan view of a characteristic part showing another semiconductor device according to the embodiment 4 of the present invention.
Figure 52:
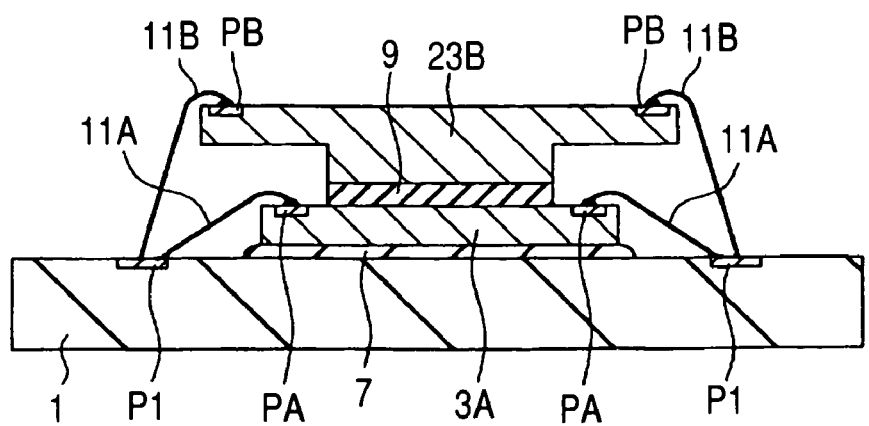
FIG. 52 is a cross-sectional view of a characteristic part showing another semiconductor device according to the embodiment 4 of the present invention.

FIG. 50 and FIG. 51 are plan views showing another semiconductor device of this embodiment and FIG. 52 is a cross-sectional view showing another semiconductor device of this embodiment. FIG. 52 corresponds to a cross-section taken along a line B—B in FIG. 51, for example.

The semiconductor chips 3A, 23B shown in FIG. 50 are stacked as shown in FIG. 51 and FIG. 52. The semiconductor chips 3A, 23B are arranged in directions such that the respective longitudinal directions cross each other; and, at the same time, the semiconductor chips 3A, 23B are arranged such that some pads PA of the semiconductor chip 3A and the semiconductor chip 23B overlap each other. Further, the semiconductor chip 23B adopts the inversely projecting shape which has been explained in detail in conjunction with the embodiment 3.

Also, in the semiconductor device having such a structure, it is necessary to perform bonding of wires 11A before stacking the semiconductor chip 23B which constitutes the upper layer. That is, before stacking the semiconductor chip 23B, it is necessary to perform the heat treatment for fixing the semiconductor chip 3A which constitutes the lower layer using resin.

Accordingly, as explained in conjunction with the embodiment 3 or the like, to an upper surface of a mounting substrate 1, using resin in a paste form having a thermosetting property (adhesive material 7), the semiconductor 3A which is disposed above the mounting substrate 1 is adhered (fixed). Then, at the time of adhering the semiconductor chip 23B after conducting the heat treatment for curing the above-mentioned resin, resin in a film form having a thermoplastic property (adhesive material 9) is used. Here, the constitution and the manufacturing method of the semiconductor device shown in FIG. 52 or the like are substantially the same as those employed in the embodiment 3, and, hence, the same symbols are given to corresponding parts, and a detailed explanation of the parts is omitted. Further, also in the drawing, the illustration of the mold resin 13 and the bump electrodes 15 is omitted.

However, when the adhesive area of a back surface of the semiconductor chip 23B is small, the influence attributed to warping of the semiconductor chip 3A which constitutes the lower layer is small, and, hence, when the length of the adhesive area in the longitudinal direction is 5 mm or less, for example, resin in a paste form having a thermosetting property (adhesive material 7) may be used for adhesion of the semiconductor chip 23B. On the other hand, when the length of the adhesive area in the longitudinal direction exceeds 5 mm, it is desirable to use resin in a film form having a thermoplastic property (adhesive material 9) at the time of adhering the semiconductor chip 23B.

Here, although the semiconductor chip which constitutes the upper layer is formed in an inversely projecting shape in this embodiment, the spacer chip shown in the embodiment 1 or 2 may be used.

Embodiment 5

Although two semiconductor chips 3A, 23B are stacked in the embodiment 3, it is also possible to stack a larger number of semiconductor chips.

Figure 53:
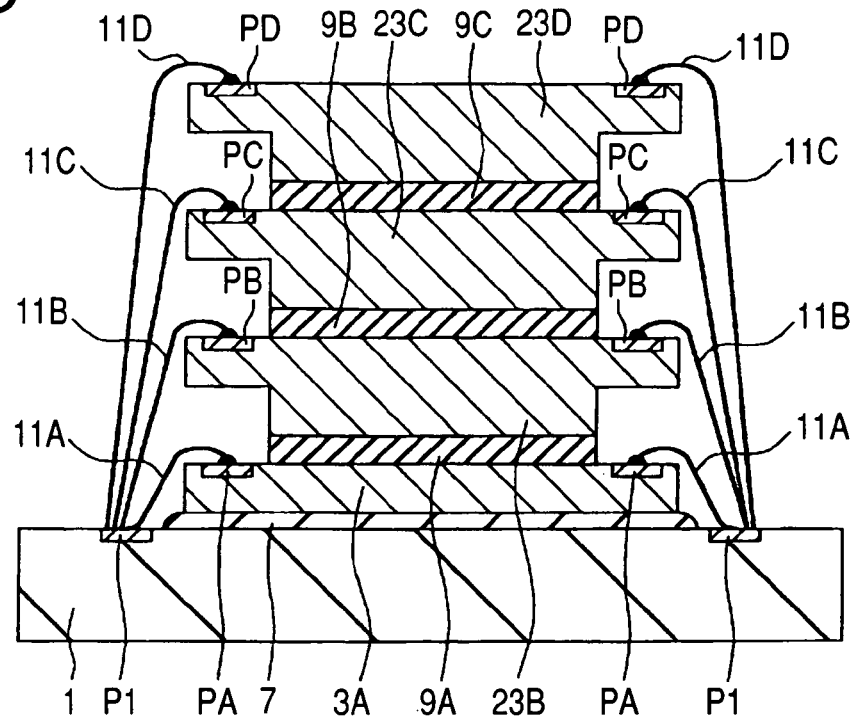
FIG. 53 is a cross-sectional view of a characteristic part showing a semiconductor device according to an embodiment 5 of the present invention.

FIG. 53 is a cross-sectional view showing a semiconductor device of this embodiment. Here, in the drawing, the indication of mold resin 13 and bump electrodes 15 is omitted. As shown in the drawing, a semiconductor chip 23C is stacked on a semiconductor chip 23B and as semiconductor chip 23D is stacked on the semiconductor 23C. Further, pads (PA, PB, PC, PD) formed on surfaces of the respective semiconductor chips are connected with pads P1 formed on a surface of a mounting substrate 1 via wires (11A, 11B, 11C, 11D). Further, the pads (PA, PB, PC, PD) of the respective semiconductor chips are arranged such that the pads (PA, PB, PC, PD) are overlapped in plane to the semiconductor chip disposed above the pads, and, hence, it is necessary to perform wire bonding sequentially. Accordingly, the semiconductor chip 3A is adhered using resin in a paste form having a thermosetting property (adhesive material 7), and other semiconductor chips (23B, 23C, 23D) are adhered using a resin in a film form having a thermoplastic property (adhesive material 9A, 9B, 9C).

Here, the constitution and the method of manufacture of the semiconductor device of this embodiment below the semiconductor chip 23B are substantially the same as those in the embodiment 3, and, hence, the same symbols are given to corresponding parts and a detailed explanation of the parts is omitted.

Further, the semiconductor chips 23B, 23C, 23D are, in the same manner as the semiconductor chip 23B of the embodiment 3, fixed to the semiconductor chip which constitutes the lower layer using resin in a film form having a thermoplastic property, and, hence, a detailed explanation thereof is omitted.

Here, although the semiconductor chip which constitutes the upper layer is formed in an inversely projecting shape in this embodiment, the spacer chip shown in the embodiment 1 or 2 may be used.

Embodiment 6

In the embodiment 5, the semiconductor chips 23B, 23C, 23D are formed in an inversely projecting shape. However, the semiconductor chip 3A which constitutes a lowermost layer may be also formed to have an inversely projecting shape.

Figure 54:
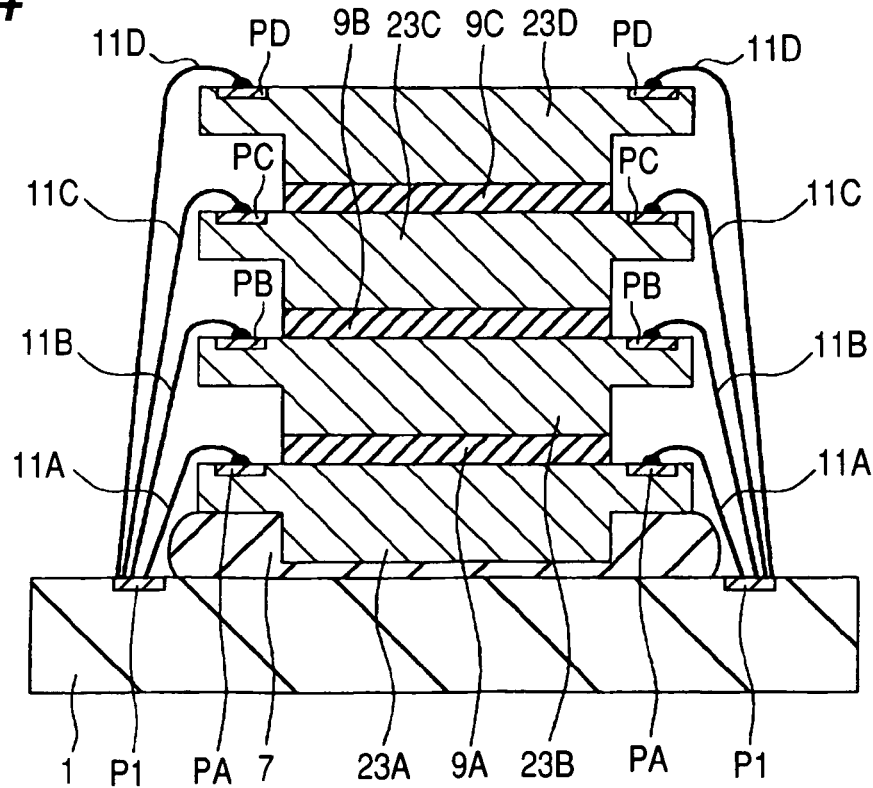
FIG. 54 is a cross-sectional view of a characteristic part showing a semiconductor device according to an embodiment 6 of the present invention.

FIG. 54 is a cross-sectional view showing a semiconductor device according to this embodiment. Since the constitution and the manufacturing method of the semiconductor device are same as those of the embodiment 5, except for the face that the shape of the semiconductor chip 23A which constitutes the lowermost layer has an inversely projecting shape, a detailed explanation thereof is omitted. Here, in the drawing, the illustration of the mold resin 13 and the bump electrodes 15 is omitted.

Figure 55:
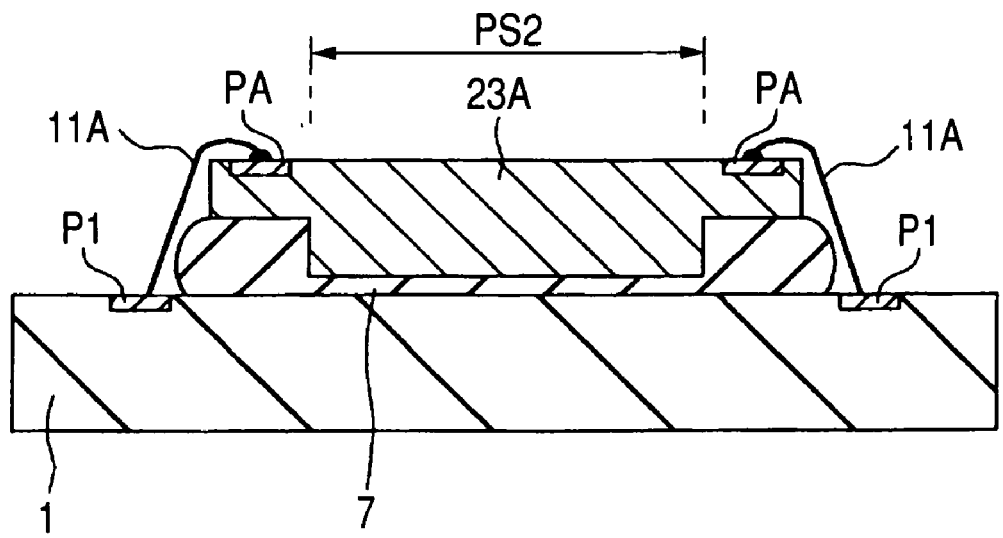
FIG. 55 is a cross-sectional view of a characteristic part showing another semiconductor device according to the embodiment 6 of the present invention.
Figure 56:
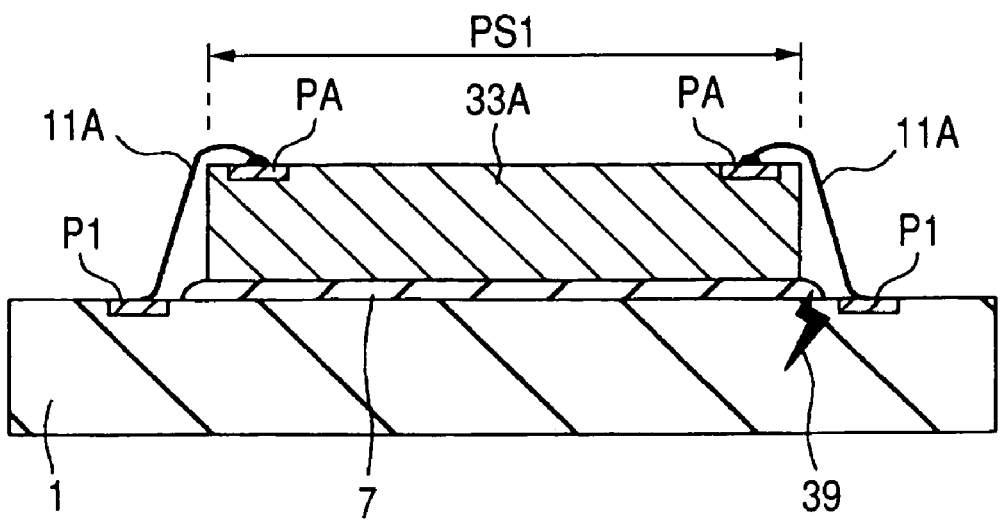
FIG. 56 is a cross-sectional view of a characteristic part showing the semiconductor device for explaining an advantageous effect of the embodiment 6 of the present invention.

Especially, in this embodiment, since the semiconductor chip 23A formed directly above the mounting substrate 1 is formed to have an inversely projecting shape, an advantageous effect which will be explained hereinafter is obtained. Here, since the advantageous effect is similar to the advantageous effect obtained when a single-layered semiconductor chip having an inversely projecting shape is mounted, the advantageous effect will be explained in conjunction with FIG. 55 and FIG. 56. FIG. 55 is a cross-sectional view showing another semiconductor device according to this embodiment and FIG. 56 is a cross-sectional view showing a semiconductor device for explaining the advantageous effect of this embodiment.

As shown in FIG. 55, when the semiconductor chip 23A is formed to have an inversely projecting shape, the facing area defined between the mounting substrate 1 and a back surface of the semiconductor chip 23A becomes small. On the other hand, for example, as shown in FIG. 56, when the semiconductor chip 33A having a size PS1 is mounted on the mounting substrate 1, a facing area between the mounting substrate 1 and the back surface of the semiconductor chip 33A becomes large, and, hence, cracks are liable to easily occur in the inside of the mounting substrate 1 due to stress. Particularly, in the neighborhood of the end portion of the semiconductor chip 33A, the stress is easily concentrated and a crack 39 is easily generated. Further, even if the crack is not generated, a plurality of wiring layers in the mounting substrate 1 can be easily become disconnected due to the stress.

To the contrary, when the semiconductor chip 23A is formed to have an inversely projecting shape, the facing area becomes small and the stress can be alleviated. In other words, the stress becomes substantially equal to the stress in the case in which the semiconductor chip having an apparent size of PS2 (<PS1) is mounted on the mounting substrate 1. Accordingly, the generation of cracks in the mounting substrate 1 can be prevented. Further, by reducing the stress, the flatness of the semiconductor chip 23A is enhanced, and, hence, the ensuing manufacturing steps can be facilitated. Especially, when the semiconductor chips are stacked, the adhesive property of the semiconductor chip formed in the upper layer can be enhanced. Further, even when a thermal load is applied to the semiconductor chip 23A in a temperature cycle test (T cycle test), which is performed after the semiconductor device is completed, the stress can be alleviated. Accordingly, the T cycle characteristics can be enhanced.

Further, since resin in a paste form having a thermosetting property (adhesive material 7) is filled in the cutout portion, the quantity of resin projecting from an end portion of the semiconductor chip 23A can be reduced, and, hence, it is possible to prevent the resin from flowing onto the pads P1.

Embodiment 7

In FIG. 54, which shows embodiment 6, the semiconductor chip which constitutes the upper layer is always overlapped with the semiconductor chip which constitutes the lower layer in plane. However, as shown in this embodiment, a semiconductor chip of an upper layer which is smaller than a semiconductor chip of a lower layer may be stacked.

Figure 57:
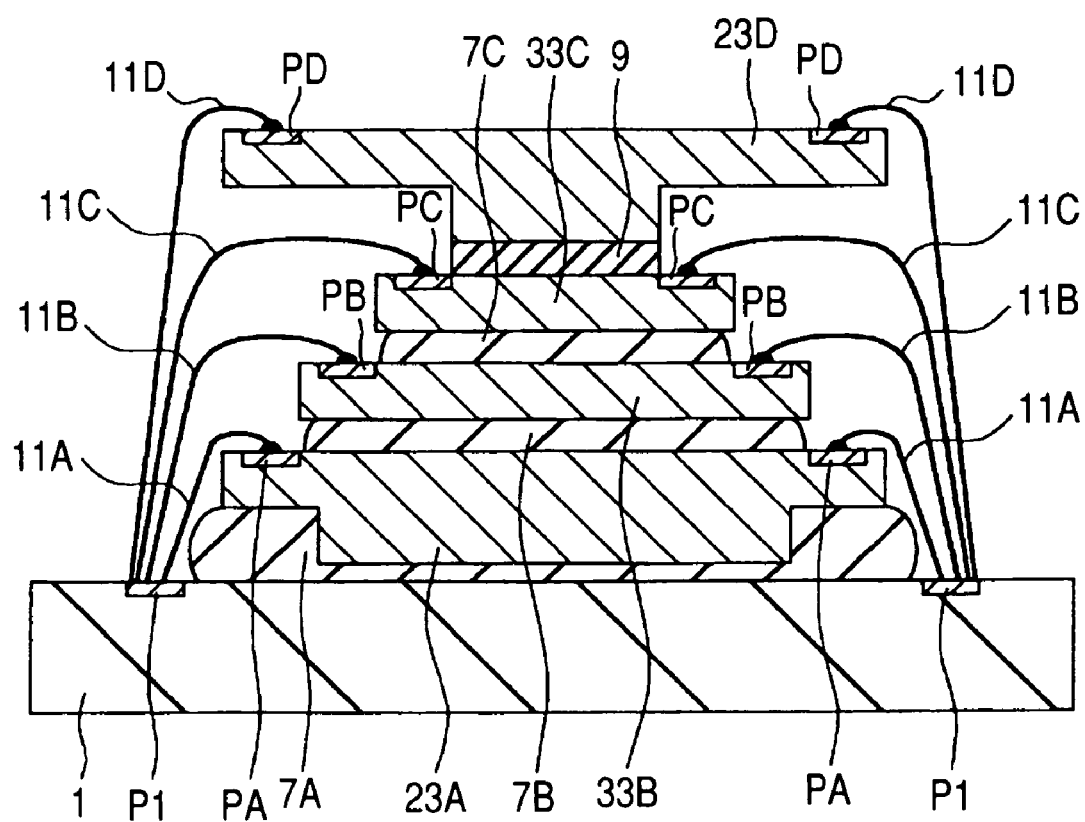
FIG. 57 is a cross-sectional view of a characteristic part showing a semiconductor device according to an embodiment 7 of the present invention.

FIG. 57 is a cross-sectional view showing the semiconductor device according to this embodiment. Since the constitution and the manufacturing method of the semiconductor device are, except for the shapes of the semiconductor chips 33B, 33C, substantially the same as the constitution and the manufacturing method of the semiconductor device of the embodiment 6, a detailed explanation thereof is omitted. Here, in this drawing, the indication of a mold resin 13 and bump electrodes 15 is omitted.

In this case, although the semiconductor chip 33B is fixed to an upper portion of the semiconductor chip 23A, the semiconductor chip 33B is slightly smaller than the semiconductor chip 23A, and, hence, pads PA are exposed even after the semiconductor chip 33B is mounted on the semiconductor chip 23A.

In the same manner, on an upper portion of the semiconductor chip 33B, a semiconductor chip 33C, which is slightly smaller than the semiconductor chip 33B, is fixed, and, hence, the pads PB are exposed even after the semiconductor chip 33C is mounted on the semiconductor chip 33B.

Accordingly, in this case, the semiconductor chips 23A, 33B and 33C can be sequentially adhered by way of resin in a paste form having a thermosetting property (adhesive materials 7A, 7B, 7C); and, after three semiconductor chips are fixed simultaneously by heat treatment, bonding of the wires 11A, 11B, 11C can be performed. When the bonding is performed continuously without inserting a chip adhering step, it is assumed that the number of bonding steps is one.

Accordingly, fixing of at least the semiconductor chip 23D may be performed using a film-like resin having a thermoplastic property (adhesive material 9).

It is needless to say that, a film-like resin having a thermoplastic property (adhesive material 9) may be used also for fixing the semiconductor chips 33B and 33C.

Further, in FIG. 57, as explained in connection with the embodiment 6, the semiconductor chip 23A is formed to have an inversely projecting shape.

Although the present invention has been specifically explained in conjunction with various embodiments, it is needless to say that the present invention is not limited to the above-mentioned embodiments and various modifications can be made without departing from the gist of the present invention.

Particularly, provided that no contradiction arises, it is possible to suitably combine the constitutions of the respective embodiments. Further, although an explanation has been made with respect to the case in which the semiconductor chips are mounted on a mounting substrate in the above-mentioned embodiments, the present invention is widely applicable to a case in which the semiconductor chips are mounted on a member which differs from the semiconductor chips in the α value thereof, such as a case in which semiconductor chips are mounted on a lead frame. Further, although an explanation has been made with respect to the case in which the mounting substrate or the like warps in a convex shape in the above-mentioned embodiments, the present invention is not limited to such a case.

A brief explanation of the advantageous effects obtained by the representative aspects of the invention disclosed in this specification is as follows.

The reliability of the semiconductor device which has the plurality of semiconductor chips can be enhanced. Further, the yield rate of the semiconductor chips can be enhanced.

Further, it is possible to realize miniaturization and high-density packaging of a semiconductor device having a plurality of semiconductor chips.

The invention claimed is:

1. A method of manufacturing a semiconductor device comprising steps of:
   (a) mounting a first semiconductor chip over a mounting substrate by way of a first adhesive material;
   (b) fixing the first semiconductor chip to the mounting substrate by curing the first adhesive material by heat treatment after the step (a); and (c) mounting, after the step (b), a second semiconductor chip over the first semiconductor chip, in which the second semiconductor chip is adhered to the first semiconductor chip by way of a second adhesive material in a state that a surface of the first semiconductor chip is made flatter than the state before applying heat by applying the heat to the mounting substrate and the first semiconductor chip.

2. A method of manufacturing a semiconductor device according to claim 1, wherein the first adhesive material is mainly made of resin having thermosetting property and the second adhesive material is made of resin having the thermoplastic property.

3. A method of manufacturing a semiconductor device according to claim 1, wherein the second adhesive material is made of film-like resin.

4. A method of manufacturing a semiconductor device according to claim 1, wherein the method includes a step of connecting first pads formed over a surface of the first semiconductor chip and second pads formed over a surface of the mounting substrate using wires between the step (b) and the step (c).

5. A method of manufacturing a semiconductor device according to claim 4, wherein the second semiconductor chip is arranged to overlap the first pads of the first semiconductor chip in plane.

6. A method of manufacturing a semiconductor device according to claim 1, including a step of mounting a spacer chip over the first semiconductor chip by way of the first adhesive material between the step (a) and the step (b), wherein the step (b) is a step of fixing the first semiconductor chip to the mounting substrate and fixing the spacer chip to the first semiconductor chip by curing the first adhesive material by heat treatment.

7. A method of manufacturing a semiconductor device according to claim 1, wherein the step (c) is a step of adhering the spacer chip to the mounting substrate by way of the second adhesive material and adhering the second semiconductor chip to the spacer chip by way of the second adhesive material in a state that the surface of the first semiconductor chip is made flatter than the state before applying heat by applying the heat to the mounting substrate and the first semiconductor chip.

8. A method of manufacturing a semiconductor device according to claim 1,
wherein the second semiconductor chip includes a cutout portion in an outer peripheral portion of a back surface thereof and includes a projecting portion at a center portion of the back surface, and
wherein the projecting portion is adhered to the first semiconductor chip by way of the second adhesive material.

9. A method of manufacturing a semiconductor device according to claim 8, wherein the cutout portion of the second semiconductor chip is arranged to overlap the first pads of the first semiconductor chip in plane.

* * * * *